(12) United States Patent
Tanaka et al.

(10) Patent No.: US 7,868,523 B2
(45) Date of Patent: Jan. 11, 2011

(54) ELASTIC WAVE DEVICE AND METHOD OF PRODUCING THE SAME

(75) Inventors: Nobuhira Tanaka, Yasu (JP); Hisashi Yamazaki, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/696,080

(22) Filed: Jan. 29, 2010

(65) Prior Publication Data
US 2010/0117483 A1    May 13, 2010

Related U.S. Application Data

(63) Continuation of application No. PCT/JP2008/061837, filed on Jun. 30, 2008.

(30) Foreign Application Priority Data
Jul. 30, 2007  (JP)  ............ 2007-197335

(51) Int. Cl.
 H01L 41/08  (2006.01)
 H01L 41/047 (2006.01)
 H01L 41/053 (2006.01)
 H03H 9/25   (2006.01)

(52) U.S. Cl. ............... 310/364; 310/313 R; 310/348; 310/366

(58) Field of Classification Search ............ 310/313 R, 310/348, 363–366; 333/193–196
See application file for complete search history.

(56) References Cited

U.S. PATENT DOCUMENTS

RE38,278 E  *  10/2003  Satoh et al. ............. 310/313 R
2002/0024271 A1    2/2002  Hori et al.
2003/0151329 A1    8/2003  Kadota et al.

(Continued)

FOREIGN PATENT DOCUMENTS

EP   1 184 978 A2   3/2002

(Continued)

OTHER PUBLICATIONS

Official Communication issued in International Patent Application No. PCT/JP2008/061837, mailed on Sep. 30, 2008.

*Primary Examiner*—Thomas M Dougherty
(74) *Attorney, Agent, or Firm*—Keating & Bennett, LLP

(57) ABSTRACT

An elastic wave device has a structure that prevents cracks from being formed in a piezoelectric substrate in flip-chip bonding using a bump, that minimizes the contact resistance in a contact portion where wiring patterns are electrically connected to each other, and that improves the insertion loss. In the elastic wave device, first and second multilayer electrically conductive films are provided on a piezoelectric substrate, the first multilayer electrically conductive film defines an IDT electrode and a first wiring pattern, the second multilayer electrically conductive film defines an electrode pad to which a bump is connected and a second wiring pattern, at least one contact portion where the second wiring pattern is overlapped on the first wiring pattern so as to be electrically connected to each other is provided, a top electrically conductive film of the first multilayer electrically conductive film is a Ti film, and a bottom electrically conductive film of the second multilayer electrically conductive film is an Al-based electrically conductive film including Al or an alloy mainly containing an Al.

4 Claims, 17 Drawing Sheets

U.S. PATENT DOCUMENTS

| | | | |
|---|---|---|---|
| 2004/0070313 A1* | 4/2004 | Furukawa et al. | 310/313 R |
| 2004/0178698 A1* | 9/2004 | Shimoe et al. | 310/313 R |
| 2004/0256949 A1 | 12/2004 | Hada et al. | |
| 2008/0012450 A1 | 1/2008 | Meister et al. | |
| 2009/0243430 A1* | 10/2009 | Yokota et al. | 310/313 B |

FOREIGN PATENT DOCUMENTS

| | | | |
|---|---|---|---|
| JP | 04-294625 A | | 10/1992 |
| JP | 2002-043888 A | | 2/2002 |
| JP | 2002-100951 A | | 4/2002 |
| JP | 2002-261560 A | | 9/2002 |
| JP | 2002-531980 A | | 9/2002 |
| JP | 2003-174056 A | * | 6/2003 |
| JP | 2003-174056 A | | 6/2003 |
| JP | 2003-188679 A | | 7/2003 |
| JP | 2005-197595 A | * | 7/2005 |
| JP | 2005-197595 A | | 7/2005 |
| JP | 2006-115548 A | | 4/2006 |
| WO | 00/33394 A1 | | 6/2000 |
| WO | 2006/058579 A1 | | 6/2006 |

\* cited by examiner

US 7,868,523 B2

ELASTIC WAVE DEVICE AND METHOD OF PRODUCING THE SAME

BACKGROUND OF THE INVENTION

1. Field of the Invention

The present invention relates to an elastic wave device used as, for example, a resonator or a band-pass filter, and a method of producing the same. More specifically, the present invention relates to an elastic wave device in which a portion where wiring patterns on a piezoelectric substrate are stacked on each other is improved, and a method of producing the same.

2. Description of the Related Art

Recently, with the reduction in the size of mobile phones, the reduction in the size of a band-pass filter used in mobile phones has also been strongly desired. As such a band-pass filter, a surface acoustic wave device using surface acoustic waves has been widely used. In a surface acoustic wave device, in order to achieve the reduction in the size thereof, a surface acoustic wave filter chip, in which electrically conductive films for forming an interdigital transducer (IDT) and the like are provided on a piezoelectric substrate, is connected to a package not by wire bonding but by flip-chip bonding using bumps.

Japanese Unexamined Patent Application Publication No. 2006-115548 described below discloses an example of such a surface acoustic wave device.

FIG. 23 is a partially cutaway front cross-sectional view illustrating the surface acoustic wave device disclosed in Japanese Unexamined Patent Application Publication No. 2006-115548. A surface acoustic wave device 1001 includes a piezoelectric substrate 1002. An IDT 1003 composed of a multilayer electrically conductive film is provided on the piezoelectric substrate 1002. The IDT 1003 includes a main electrode layer 1003a composed of Cu. An adhesive layer 1003b composed of Ti is stacked under the main electrode layer 1003a. The formation of the adhesive layer 1003b composed of Ti increases the adhesion strength of the IDT 1003 to the piezoelectric substrate 1002.

A protective layer 1003c composed of Al is stacked on the main electrode layer 1003a. Since Al is less easily oxidized than Cu, the main electrode layer 1003a can be protected by the protective layer 1003c. Note that, in the surface acoustic wave device 1001, in order to improve frequency temperature characteristics and to protect the device, the IDT 1003 is covered with a silicon oxide film 1004.

On the other hand, Japanese Unexamined Patent Application Publication No. 2003-174056 described below discloses an IDT including an underlying layer composed of Ti and disposed on a piezoelectric substrate and a main electrode layer composed of Al and disposed on the underlying layer. That is, an IDT having a stacked structure of Al/Ti from the top in that order is disclosed. In addition, in Japanese Unexamined Patent Application Publication No. 2003-174056, an electrode pad that is electrically connected to the IDT includes a lower electrode composed of Al, an upper electrode composed of Al, and a barrier layer composed of Ti and stacked between the lower electrode and the upper electrode. That is, the electrode pad has a stacked structure of Al/Ti/Al from the top in that order. This is so that the formation of cracks of the piezoelectric substrate is prevented during bonding using bumps in flip-chip bonding by forming the lower electrode composed of Al, which is relatively soft, on the piezoelectric substrate.

As described in Japanese Unexamined Patent Application Publication No. 2003-174056, in an electrode pad portion where bump bonding is performed, cracks in the piezoelectric substrate can be prevented by providing the bottom electrode layer composed of Al.

Now, it is assumed that a wiring pattern leading to an IDT of a surface acoustic wave device is referred to as "a first wiring pattern", and a wiring pattern leading to the above-mentioned electrode pad is referred to as "a second wiring pattern".

The second wiring pattern leading to the electrode pad is simultaneously formed with the electrode pad. Accordingly, when the electrode pad portion is formed as described in Japanese Unexamined Patent Application Publication No. 2003-174056, the second wiring pattern leading to the electrode pad similarly also has the stacked structure of Al/Ti/Al. In a contact portion where such a second wiring pattern is overlapped with the first wiring pattern leading to an IDT to establish an electrical connection, the Al film, which is the bottom electrically conductive film of the second wiring pattern, is overlapped with the top electrically conductive film of the first wiring pattern.

Accordingly, as described in Japanese Unexamined Patent Application Publication No. 2006-115548, when the multilayer electrically conductive film constituting the IDT has a stacked structure of Al/Cu/Ti, the first wiring pattern also has the same stacked structure. Accordingly, in the contact portion, an Al film and an Al film are overlapped with each other. In such a structure, the contact resistance in the contact portion increases, and thus the insertion loss of the surface acoustic wave device tends to degrade.

SUMMARY OF THE INVENTION

The inventor of the present invention tried to form an IDT and a first wiring pattern leading to the IDT, both of which are composed of a multilayer electrically conductive film including Al/Ti/Pt/NiCr alloy from the top in that order in order to increase reliability and the electrical power resistance. By using, as a main electrode layer, an Al film and a Pt film, in particular, a Pt film, which has a higher density than Al, the coefficient of reflection can be increased. However, also in such a case, when the second wiring pattern leading to the electrode pad has a structure of Al/Ti/Al, an Al film is similarly overlapped with an Al film in a contact portion, which is a connecting portion of the two wiring patterns. It was discovered that, consequently, the contact resistance increased, thereby degrading the insertion loss of a surface acoustic wave device.

Accordingly, preferred embodiments of the present invention provide an elastic wave device in which cracks of a piezoelectric substrate are prevented from being formed during flip-chip bonding, and the contact resistance in a contact portion where wiring patterns are electrically connected to each other can be reduced, thereby improving the insertion loss.

According to a first preferred embodiment of the present invention, an elastic wave device includes a piezoelectric substrate, a first multilayer electrically conductive film disposed on the piezoelectric substrate, and a second multilayer electrically conductive film disposed on the piezoelectric substrate, wherein the first multilayer electrically conductive film defines at least an IDT including a plurality of electrode fingers and a first wiring pattern connected to the IDT, the second multilayer electrically conductive film defines at least an electrode pad and a second wiring pattern leading to the electrode pad, at least one contact portion where the second wiring pattern is overlapped with the first wiring pattern is provided, the second multilayer electrically conductive film includes a bottom electrically conductive film composed of Al or an alloy mainly containing Al, and the first multilayer electrically conductive film includes a top electrically conductive film composed of Ti and an Al-based electrically conductive film composed of Al or an alloy mainly containing Al and disposed lower than the top electrically conductive film.

According to a second preferred embodiment of the present invention, an elastic wave device includes a piezoelectric substrate, a first multilayer electrically conductive film disposed on the piezoelectric substrate, and a second multilayer electrically conductive film disposed on the piezoelectric substrate, wherein the first multilayer electrically conductive film defines at least an IDT including a plurality of electrode fingers and a first wiring pattern connected to the IDT, the second multilayer electrically conductive film defines at least an electrode pad and a second wiring pattern leading to the electrode pad, an interlayer electrically conductive film stacked between the first wiring pattern and the second wiring pattern is further provided in at least one contact portion where the second wiring pattern is overlapped with the first wiring pattern, the second multilayer electrically conductive film includes a bottom electrically conductive film composed of Al or an alloy mainly containing Al, and a top electrically conductive film of the first multilayer electrically conductive film is an Al-based electrically conductive film composed of Al or an alloy mainly containing Al.

According to a third preferred embodiment of the present invention, an elastic wave device includes a piezoelectric substrate, a first multilayer electrically conductive film disposed on the piezoelectric substrate, and a second multilayer electrically conductive film disposed on the piezoelectric substrate, wherein the first multilayer electrically conductive film defines at least an IDT including a plurality of electrode fingers and a first wiring pattern connected to the IDT, the second multilayer electrically conductive film defines at least an electrode pad and a second wiring pattern leading to the electrode pad, an interlayer electrically conductive film stacked between the first wiring pattern and the second wiring pattern is further provided in at least one contact portion where the second wiring pattern is overlapped with the first wiring pattern, the second multilayer electrically conductive film includes a bottom electrically conductive film composed of Al or an alloy mainly containing Al, and the first multilayer electrically conductive film includes a top electrically conductive film composed of Ti and an Al-based electrically conductive film composed of Al or an alloy mainly containing Al and disposed lower than the top electrically conductive film.

In the second and third preferred embodiments of the present invention, the interlayer electrically conductive film is preferably composed of Ti, for example. In this case, the contact resistance in the contact portion can be reduced. Accordingly, the insertion loss can be reduced.

In the first to third preferred embodiments of the present invention, preferably, the first multilayer electrically conductive film includes a high-density electrically conductive film stacked lower than the Al-based electrically conductive film and composed of a metal having a higher density than Al, other than Cu, Au, and Ag, or an alloy mainly containing the metal. In this case, since the high-density electrically conductive film is provided, the electrical power resistance and reliability can be improved.

More preferably, in the first multilayer electrically conductive film, a Ti film is stacked between the Al-based electrically conductive film and the high-density electrically conductive film. Accordingly, diffusion between Al or an alloy mainly containing Al and the metal or alloy constituting the high-density electrically conductive film can be prevented.

The metal having a higher density than Al is not particularly limited, but Pt is preferably used, for example.

Furthermore, in a preferred embodiment of the present invention, preferably, the second multilayer electrically conductive film further includes a Ti film disposed higher than the bottom electrically conductive film and an Al-based electrically conductive film disposed higher than the Ti film and composed of Al or an alloy mainly containing Al. In this case, a structure of Al/Ti/AlCu alloy can be formed. Accordingly, high bonding reliability with an Au bump formed on Al can be realized.

The elastic device according to a preferred embodiment of the present invention may further include a package. In this case, an elastic wave filter chip including the piezoelectric substrate and the first and second multilayer electrically conductive films is preferably flip-chip bonded to the package. Even when flip-chip bonding is performed, cracks in the piezoelectric substrate can be reliably prevented because the second multilayer electrically conductive film includes the bottom electrically conductive film composed of Al or an alloy mainly containing Al, and thus bump bonding can be established on the electrode pad composed of the second multilayer electrically conductive film provided on the piezoelectric substrate.

According to a fourth preferred embodiment of the present invention, a method of producing an elastic wave device including a piezoelectric substrate and first and second multilayer electrically conductive films disposed on the piezoelectric substrate, in which the first multilayer electrically conductive film defines at least an IDT including a plurality of electrode fingers and a first wiring pattern leading to the IDT, the second multilayer electrically conductive film defines at least an electrode pad and a second wiring pattern leading to the electrode pad, and the second wiring pattern is overlapped on the first wiring pattern in at least one contact portion, includes the steps of forming, on the piezoelectric substrate, a first resist pattern having an opening located in a portion where the first multilayer electrically conductive film is to be formed; forming at least an Al-based electrically conductive film composed of Al or an alloy mainly containing Al and a Ti film in that order in order to form the first multilayer electrically conductive film; removing the first resist pattern and unnecessary metal films on the first resist pattern by lift-off; forming, on the piezoelectric substrate, a second resist pattern having an opening located in a portion where the second multilayer electrically conductive film is to be formed; and forming at least an Al-based electrically conductive film composed of Al or an alloy mainly containing Al in order to form the second multilayer electrically conductive film.

According to a fifth preferred embodiment of the present invention, a method of producing an elastic wave device including a piezoelectric substrate and first and second multilayer electrically conductive films disposed on the piezoelectric substrate, in which the first multilayer electrically conductive film defines at least an IDT including a plurality of electrode fingers and a first wiring pattern leading to the IDT, the second multilayer electrically conductive film defines at least an electrode pad and a second wiring pattern leading to the electrode pad, and the second wiring pattern is overlapped on the first wiring pattern in at least one contact portion, includes the steps of forming, on the piezoelectric substrate, a first resist pattern having an opening located in a portion where the first multilayer electrically conductive film is to be formed; forming an Al-based electrically conductive film composed of Al or an alloy mainly containing Al in order to form the first multilayer electrically conductive film; removing the first resist pattern and an unnecessary metal film on the first resist pattern by lift-off; forming a second resist pattern having an opening located in a portion including at least the contact portion; forming a metal film for forming the interlayer electrically conductive film; removing the second resist pattern and an unnecessary metal film on the second resist pattern by lift-off; forming, on the piezoelectric substrate, a third resist pattern having an opening located in a portion where the second multilayer electrically conductive film is to be formed; and forming an Al-based electrically conductive film composed of Al or an alloy mainly containing Al in order to form the second multilayer electrically conductive film.

In the fourth and fifth preferred embodiments of the present invention, preferably, the method further includes the steps of forming a high-density metal film composed of a metal having a higher density than Al, other than Cu, Au, and Ag, or an alloy mainly containing the metal and a Ti film in that order before the formation of the Al-based electrically conductive film for forming the first multilayer electrically conductive film, and forming a Ti film and an Al-based electrically conductive film composed of Al or an alloy mainly containing Al in that order after the formation of the Al-based electrically conductive film for forming the second multilayer electrically conductive film.

In the elastic wave device according to the first preferred embodiment of the present invention, an electrode pad preferably includes a second multilayer electrically conductive film, and the second multilayer electrically conductive film includes, as a bottom electrically conductive film, an Al-based electrically conductive film composed of Al or an alloy mainly containing Al. Accordingly, even when flip-chip bonding using a bump is performed on the electrode pad, cracks are not readily formed in a piezoelectric substrate because the bottom electrically conductive film that is in contact with the piezoelectric substrate is relatively soft.

Furthermore, a first wiring pattern preferably includes a first multilayer electrically conductive film and a second wiring pattern preferably includes the second multilayer electrically conductive film. Accordingly, a top electrically conductive film of the first multilayer electrically conductive film is composed of Ti and the bottom electrically conductive film of the second multilayer electrically conductive film is composed of an Al-based electrically conductive film. Therefore, the contact resistance between the Ti film and the Al-based electrically conductive film is relatively low. Consequently, the contact resistance can be reduced whereby the insertion loss can be improved.

Also in the elastic wave device according to the second preferred embodiment of the present invention, an electrode pad preferably includes a second multilayer electrically conductive film, and the second multilayer electrically conductive film includes a bottom electrically conductive film composed of an Al-based electrically conductive film. Accordingly, even when flip-chip bonding using a bump is performed on the electrode pad, cracks are not readily formed in a piezoelectric substrate because the bottom electrically conductive film that is in contact with the piezoelectric substrate is relatively soft.

In the elastic wave device according to the second preferred embodiment of the present invention, in a contact portion, an interlayer electrically conductive film composed of Ti is preferably disposed between the bottom electrically conductive film of the second multilayer electrically conductive film constituting a second wiring pattern, the bottom electrically conductive film being composed of an Al-based electrically conductive film, and a top electrically conductive film of a first multilayer electrically conductive film constituting a first wiring pattern, the top electrically conductive film being composed of an Al-based electrically conductive film. Since the Al-based electrically conductive films are stacked with Ti therebetween, the contact resistance can be reduced. Consequently, the insertion loss of the elastic wave device can be reduced.

Also in the elastic wave device according to the third preferred embodiment of the present invention, an electrode pad preferably includes a second multilayer electrically conductive film, and the second multilayer electrically conductive film preferably includes a bottom electrically conductive film composed of an Al-based electrically conductive film. Accordingly, even when flip-chip bonding using a bump is performed on the electrode pad, cracks are not readily formed in a piezoelectric substrate because the bottom electrically conductive film that is in contact with the piezoelectric substrate is relatively soft.

Also in the elastic wave device according to the third preferred embodiment of the present invention, in a contact portion, an interlayer electrically conductive film composed of Ti is preferably disposed between the bottom electrically conductive film of the second multilayer electrically conductive film constituting a second wiring pattern, the bottom electrically conductive film being composed of an Al-based electrically conductive film, and a top electrically conductive film of a first multilayer electrically conductive film constituting a first wiring pattern, the top electrically conductive film being composed of Ti. Since the Ti layers are stacked on each other, the contact resistance can be reduced. Consequently, the insertion loss of the elastic wave device can be improved.

Furthermore, in the elastic wave device of the third preferred embodiment of the present invention, since the first multilayer electrically conductive film preferably includes the top electrically conductive film composed of Ti, the surface of an Al-based electrically conductive film which is a main electrode layer is protected by the Ti film. For example, in the formation of the interlayer electrically conductive film and the formation of the second multilayer electrically conductive film, a developer and the like are used, but damage of the Al-based electrically conductive film due to the developer and the like can be prevented. Accordingly, the degradation of electrical characteristics of the elastic wave device can be prevented.

According to the method of producing an elastic wave device according to the fourth preferred embodiment of the present invention, the elastic wave device according to the first preferred embodiment of the present invention can be easily obtained by conducting, on a piezoelectric substrate, the steps of forming the first resist pattern, depositing films for forming a first multilayer electrically conductive film, removing the first resist pattern and unnecessary metal films by lift-off, forming a second resist pattern, and forming a metal film for forming a second multilayer electrically conductive film.

According to the method of producing an elastic wave device according to the fifth preferred embodiment of the present invention, the elastic wave device according to the second preferred embodiment of the present invention can be easily obtained by conducting the steps of forming a first resist pattern, depositing an Al-based electrically conductive film for forming a first multilayer electrically conductive film, removing the first resist pattern and an unnecessary metal film by lift-off, forming a second resist pattern, forming a metal film for forming an interlayer electrically conductive film, removing the second resist pattern and an unnecessary metal film by lift-off, forming a third resist pattern, and forming a metal film for forming a second multilayer electrically conductive film.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described with reference to specific preferred embodiments of the present invention and the accompanying drawings.

Figure 2:
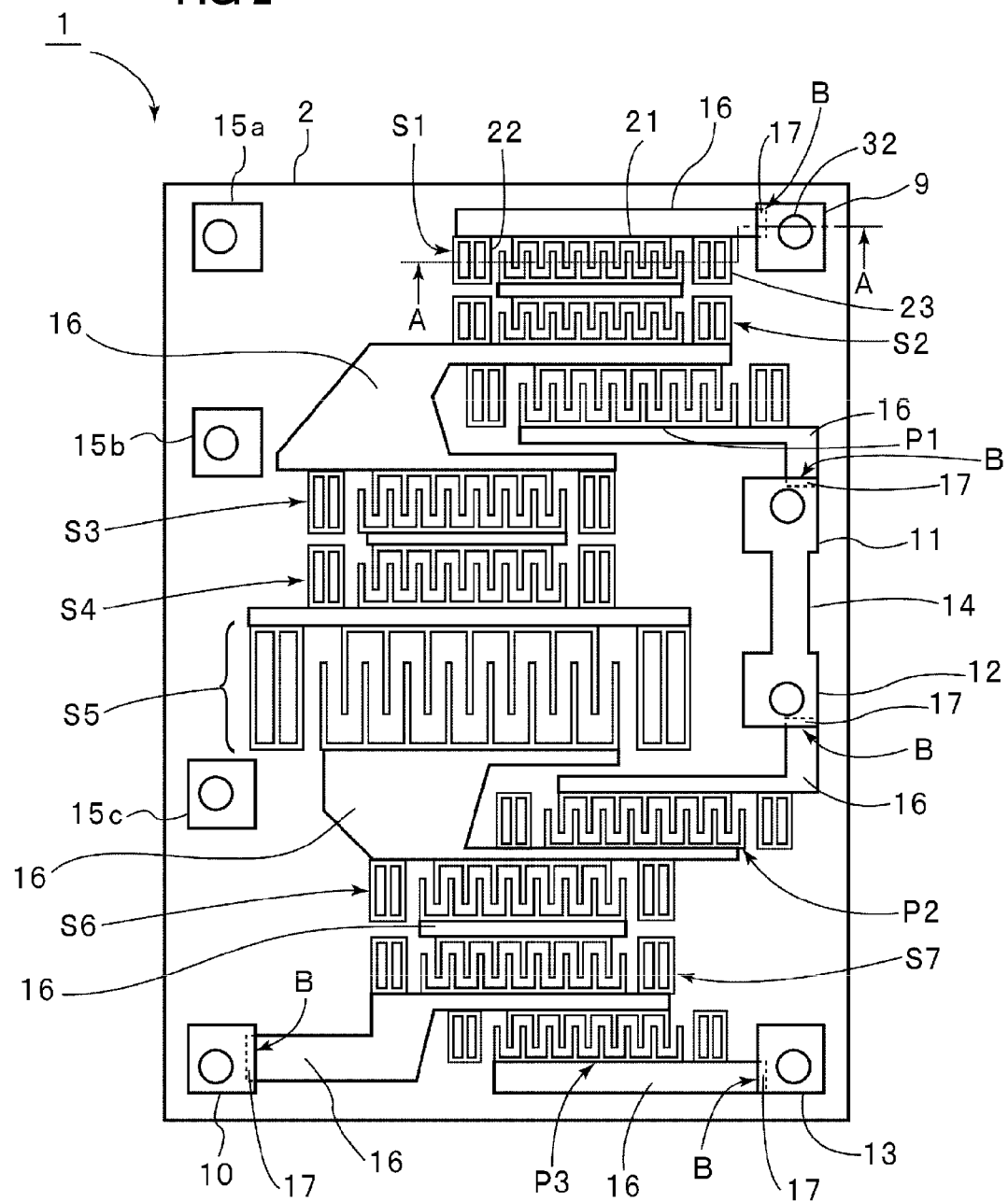
FIG. 2 is a plan view of the elastic wave device according to a preferred embodiment of the present invention.

FIG. 2 is a schematic plan view of an elastic wave device according to a first preferred embodiment of the present invention. The elastic wave device of this preferred embodiment is a surface acoustic wave device. A surface acoustic wave device 1 includes a piezoelectric substrate 2. A LiNbO$_3$ substrate having a cut angle of 126°, for example, is preferably used in this preferred embodiment. The piezoelectric substrate 2 may be composed of a LiNbO$_3$ substrate having other cut angles or other piezoelectric single crystals such as LiTaO$_3$ or quartz. Alternatively, the piezoelectric substrate 2 may be composed of a piezoelectric ceramic.

The surface acoustic wave device 1 is constituted by forming an electrode structure shown in the figure on the piezoelectric substrate 2. The surface acoustic wave device 1 is a surface acoustic wave filter having a ladder circuit configuration and is used for constituting a transmission filter 4 of a duplexer 3 shown in FIG. 3. The duplexer 3 preferably is an EGSM duplexer for a mobile phone, and a pass band of the transmission side is about 880 MHz to about 915 MHz, for example.

Figure 3:
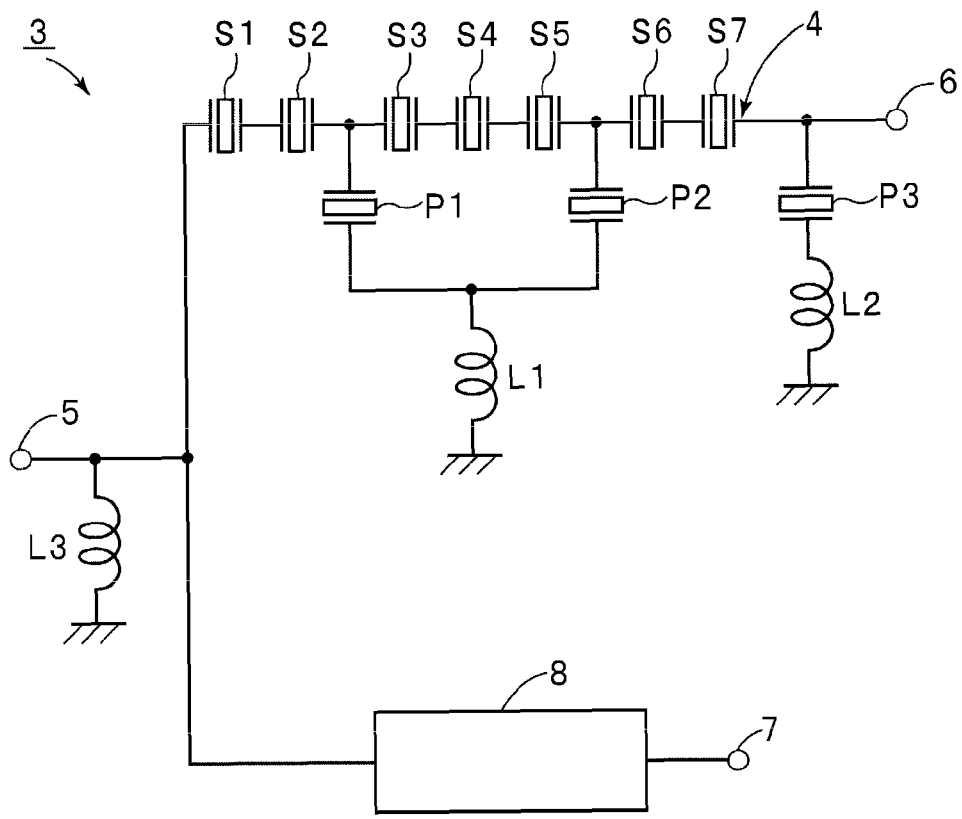
FIG. 3 is a diagram showing a circuit configuration of a duplexer in which the elastic wave device according to a preferred embodiment of the present invention is used as a transmission filter.

As shown in FIG. 3, the duplexer 3 includes an antenna terminal 5 connected to an antenna, a transmission terminal 6, and a reception terminal 7. The transmission filter 4 is connected between the antenna terminal 5 and the transmission terminal 6.

A reception filter 8 is connected between the antenna terminal 5 and the reception terminal 7. The reception filter 8 is shown by a block in FIG. 3 but can include a band-pass filter having an appropriate circuit configuration, for example, a surface acoustic wave filter having a ladder circuit configuration.

The transmission filter 4 includes a plurality of series arm resonators S1 to S7 interposed in a series arm connecting the antenna terminal 5 to the transmission terminal 6, and parallel arm resonators P1 to P3. The parallel arm resonator P1 is connected between a node between the series arm resonators S2 and S3 and a ground potential. The parallel arm resonator P2 is connected between a node between the series arm resonators S5 and S6 and the ground potential. Ends at the ground potential side of the parallel arm resonators P1 and P2 are connected in common and connected to the ground potential with an inductance L1 therebetween.

The parallel arm resonator P3 is connected between the series arm resonator S7 and the ground potential. Furthermore, an inductance L2 is connected to the parallel arm resonator P3 in series.

An inductance L3 arranged to adjust the impedance is connected between the antenna terminal 5 and the ground potential.

Referring to FIG. 2 again, the surface acoustic wave device 1 is a surface acoustic wave filter chip including the series arm resonators S1 to S7 and the parallel arm resonators P1 to P3 in the transmission filter 4 described above. More specifically, an electrode pad 10 functioning as the transmission terminal 6, to which a transmitting signal is input, and an electrode pad 9 functioning as an output terminal are provided on the piezoelectric substrate 2. Furthermore, a plurality of electrode pads 11 to 13 connected to the ground potential are provided on the piezoelectric substrate 2. The electrode pad 11 and the electrode pad 12 are electrically connected to each other with an electrically conductive connecting portion 14 therebetween.

Floating electrode pads 15a to 15c, which are not connected to the ground potential or a transmission, input, or output terminal, are also provided on the piezoelectric substrate 2.

Each of the series arm resonators S1 to S7 and the parallel arm resonators P1 to P3 is a one-port surface acoustic wave resonator that includes an IDT having a plurality of electrode fingers and a pair of reflectors disposed at both sides of the IDT in a direction in which surface acoustic waves propagate. Taking the example of the series arm resonator S1, an IDT electrode 21 having a plurality of electrode fingers interdigitating with each other and reflectors 22 and 23 disposed at both sides of the IDT electrode 21 in a direction in which surface acoustic waves propagate are provided. Note that the reason why the dimensions of the series arm resonators S1 to S7 and the parallel arm resonators P1 to P3 in FIG. 2 are different from each other is that the electrostatic capacity and the like are made different from each other in order to obtain desired filter characteristics of each resonator.

In order to form the above-described electrode structure, a first multilayer electrically conductive film and a second multilayer electrically conductive film are provided on the piezoelectric substrate 2. More specifically, the electrode pads 9 to 13, the electrically conductive connecting portion 14, and the electrode pads 15a to 15c are composed of the second multilayer electrically conductive film. A second wiring pattern 17 that is an electrode portion leading to any of the electrode pads 9 to 13 is also composed of the second multilayer electrically conductive film.

In this preferred embodiment, the second multilayer electrically conductive film has a structure in which an AlCu alloy film, a Ti film, and an Al film that are disposed on the piezoelectric substrate are stacked in that order. That is, the second multilayer electrically conductive film has a stacked structure of Al/Ti/AlCu alloy from the top in that order. The AlCu alloy is an alloy mainly containing Al, the alloy containing about 10 weight percent Cu and the balance of Al, for example. The approximate thicknesses of the individual layers are Al/Ti/AlCu alloy=1140/200/500, for example. Note that the thickness of each layer is expressed in units of nm.

In other words, the second multilayer electrically conductive film has a structure in which a Ti film is stacked between a pair of main electrodes composed of Al-based electrically conductive films made of Al or an alloy containing Al as a main component. Note that the Ti film is a barrier layer arranged to prevent diffusion between the Al film and the AlCu alloy film. The Al film and the AlCu alloy film function as main electrode layers. The term "main electrode layer" refers to a dominant electrode layer in an IDT, an electrode pad, a wiring pattern, and the like, and refers to an electrode layer having a relatively larger thickness than the above-mentioned barrier layer, a Ti film functioning as a protective layer, and a NiCr alloy film functioning as an adhesive layer described below.

Figure 1:
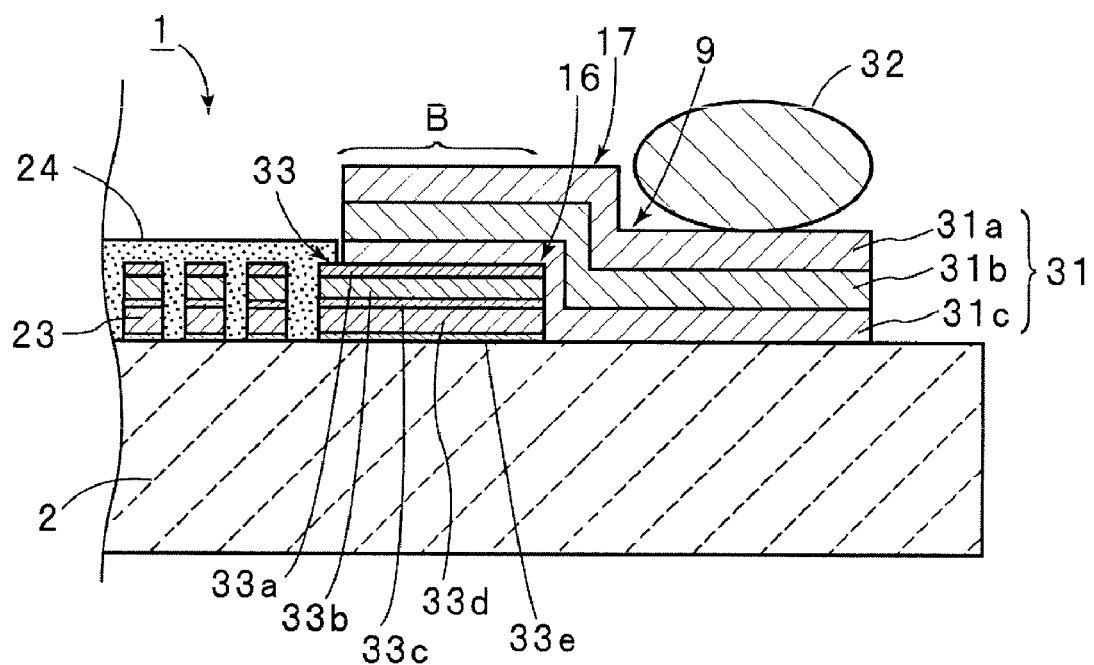
FIG. 1 is a view showing the relevant portion of an elastic wave device according to a first preferred embodiment of the present invention and is a step cross-sectional view taken along line A-A of FIG. 2.

FIG. 1 is a step cross-sectional view taken along line A-A of FIG. 2. This figure shows a state in which a bump 32 is formed on a second multilayer electrically conductive film 31 constituting the electrode pad 9. The position where the bump 32 is formed is shown by the circle in FIG. 2. Referring to FIG. 1 again, the second multilayer electrically conductive film 31 has a structure in which an Al film 31a, a Ti film 31b, and an AlCu alloy film 31c described above are stacked from the top in that order.

Thus, the relatively soft AlCu alloy film 31c is in contact with the piezoelectric substrate 2. Accordingly, when flip-chip bonding is performed using the bump 32, a large impact is not easily added to the piezoelectric substrate 2. Consequently, cracks in the piezoelectric substrate 2 can be reliably prevented.

In the electrode structure disposed on the piezoelectric substrate 2, portions other than the portions constituted by the second multilayer electrically conductive film 31 are constituted by a first multilayer electrically conductive film 33. That is, the IDT and the reflectors of each of the resonators S1 to S7 and P1 to P3 and a first wiring pattern 16 including busbars leading thereto are composed of the first multilayer electrically conductive film.

As shown in FIG. 1, an insulating film 24 is arranged so as to cover the reflector 23 near an area where the reflector 23 of the series arm resonator S1 is provided. Note that the insulating film 24 is arranged so as to also cover the IDT electrode 21 and the reflector 22 of the series arm resonator S1, and to also cover the IDTs and the reflectors of the other series arm resonators S2 to S7 and the parallel arm resonators P1 to P3.

The insulating film 24 is preferably formed as a single insulating layer in FIG. 1, for example. However, in this preferred embodiment, a $SiO_2$ film having a thickness of about 1,000 nm and a SiN film having a thickness of about 50 nm, for example, are sequentially deposited and stacked. The sum of the thickness of the $SiO_2$ film and the thickness of the SiN film is about 1,050 nm, for example.

The piezoelectric substrate 2 is preferably composed of $LiNbO_3$ as described above. Accordingly, it is believed that the absolute value of the temperature coefficient of resonant frequency TCF can be decreased by forming a $SiO_2$ film, and thus the temperature characteristics can be stabilized.

The first multilayer electrically conductive film 33 preferably has a structure in which a NiCr alloy film, a Pt film, a Ti film, an AlCu alloy film, and a Ti film are stacked in that order. The first multilayer electrically conductive film 33 includes a Ti film 33a, an AlCu alloy film 33b, a Ti film 33c, a Pt film 33d, and a NiCr alloy film 33e from the top in that order. The approximate thicknesses of the films are Ti/AlCu alloy/Ti/Pt/NiCr alloy=10/140/10/80/10 (in units of nm), for example. The AlCu alloy film 33b preferably is an AlCu alloy film containing about 1 weight percent Cu and the balance of Al, for example. The NiCr alloy film 33e preferably is a NiCr alloy film containing about 80 weight percent Ni and the balance of Cr, for example.

As shown in FIG. 1, the bottom electrically conductive film of the first multilayer electrically conductive film 33 is the NiCr alloy film 33e, which is harder than Al. However, the first multilayer electrically conductive film 33 need not be configured to be very soft because the first multilayer electrically conductive film 33 does not include a portion to which the bump 32 is bonded.

On the contrary, the NiCr alloy film 33e is excellent in terms of the adhesiveness to the piezoelectric substrate 2. Accordingly, the adhesiveness of electrode portions including the IDT electrode 21 to the piezoelectric substrate 2 can be improved.

The first multilayer electrically conductive film 33 includes, as main electrode layers, the AlCu alloy film 33b preferably having a thickness of about 140 nm and the Pt film 33d preferably having a thickness of about 80 nm, for example. Since Pt has a higher density than Al, the density of the IDT composed of the first multilayer electrically conductive film 33 can be increased. Since the IDT has a high density, the coefficient of reflection can be increased. Furthermore, unlike Cu, Pt is not readily oxidized.

Furthermore, the thin Ti film 33c is stacked as a barrier layer between the AlCu alloy film 33b and the Pt film 33d, and thus diffusion between Al and Pt does not readily occur.

Furthermore, since the AlCu alloy film 33b, which is composed of a low-resistance metal, is stacked as a main electrode layer, the resistance of the IDT can be reduced.

Furthermore, in the first multilayer electrically conductive film 33, the Ti film 33a is provided on the AlCu alloy film 33b, that is, as the top electrically conductive layer. Since the AlCu alloy film 33b is covered with the Ti film 33a, the contact resistance of a contact portion B shown in FIG. 1 can be reduced in this preferred embodiment. This mechanism will now be described in more detail.

The contact portion B is a portion where the second wiring pattern 17 is overlapped on the first wiring pattern 16 so that the first wiring pattern 16 and the second wiring pattern 17 are electrically connected to each other. In FIG. 1, the contact portion B is provided in a portion where the electrode pad 9 is connected to the series arm resonator S1. However, such contact portions are similarly provided on the piezoelectric substrate 2 in portions where the second wiring pattern 17, which leads to any of the electrode pads 10 to 13, is connected to the first wiring pattern 16.

As described above, when an Al film is directly brought into contact with another Al film in such a contact portion B, the contact resistance increases, resulting in a problem of the degradation of the insertion loss. In contrast, in this preferred embodiment of the present invention, the top electrically conductive film of the first multilayer electrically conductive film 33 is the Ti film 33a preferably having a thickness of about 10 nm, as shown in FIG. 1. On the other hand, the bottom electrically conductive film of the second multilayer electrically conductive film 31 is the AlCu alloy film 31c. Accordingly, a stacked structure of AlCu alloy/Ti is formed in the contact portion B. In this stacked structure, the contact resistance at the interface can be lower than the contact resistance at an Al—Al interface. Consequently, the insertion loss in the surface acoustic wave device 1 can be reduced.

In FIG. 2, the second wiring pattern 17 preferably overlaps only an end of the first wiring pattern 16. Alternatively, the second wiring pattern 17 may be extended so as to cover most of the first wiring pattern 16.

Figure 4:
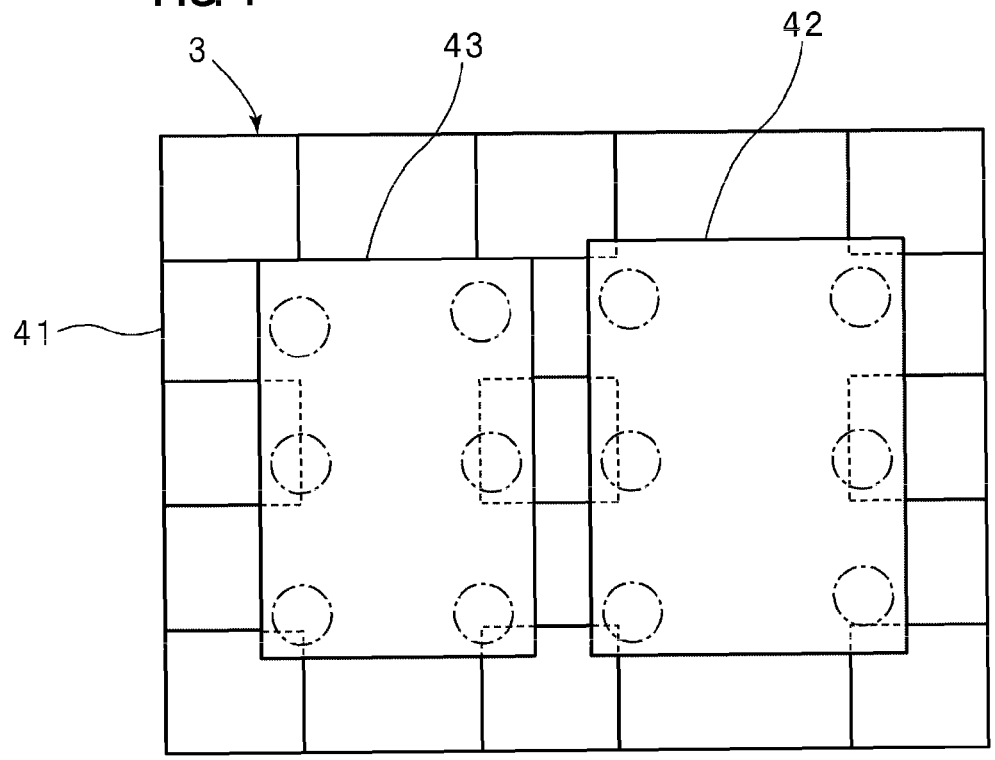
FIG. 4 is a schematic plan view of the duplexer shown in FIG. 3.

FIG. 4 is a schematic plan view of the duplexer on which the surface acoustic wave device 1 of this preferred embodiment is mounted. The duplexer 3 includes a package substrate 41 constituting a package. A surface acoustic wave filter chip 42 constituting the transmission filter 4 (see FIG. 3) and a surface acoustic wave filter chip 43 constituting the reception filter are mounted on the package substrate 41 preferably by flip-chip bonding. In FIG. 4, portions to be bonded using bumps in the flip-chip bonding are shown by the circles represented by the one-dot chain line.

The surface acoustic wave device 1 of the above preferred embodiment corresponds to this surface acoustic wave filter chip 42 at the transmission side and is mounted on the package substrate 41 by flip-chip bonding.

Figure 5:
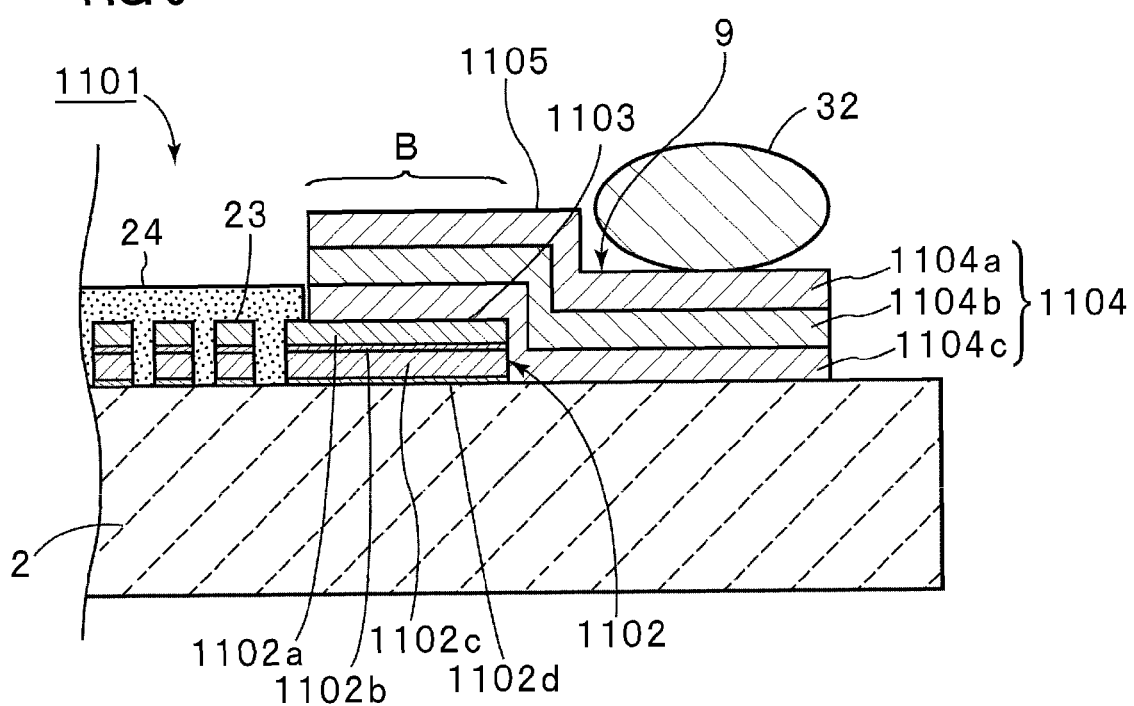
FIG. 5 is a partially cutaway cross-sectional view showing the relevant portion of an elastic wave device of a comparative example prepared for comparison to a preferred embodiment of the present invention.

FIG. 5 is a schematic step cross-sectional view illustrating the structure of a contact portion of a surface acoustic wave device prepared for comparison. The portion shown in FIG. 5 corresponds to the portion shown in FIG. 1 in the above preferred embodiment of the present invention. Accordingly, the same elements as those in the above preferred embodiment are assigned the same reference numerals.

In a surface acoustic wave device 1101 of a comparative example shown in FIG. 5, a first multilayer electrically conductive film 1102 and a second multilayer electrically conductive film 1104 are provided on a piezoelectric substrate 2. The first multilayer electrically conductive film 1102 defines an IDT electrode (not shown), a reflector 23, and a first wiring pattern 1103. On the other hand, the second multilayer electrically conductive film 1104 defines an electrode pad 9 to which a bump 32 is bonded and a second wiring pattern 1105 leading to the electrode pad 9. The second wiring pattern 1105 is overlapped on the first wiring pattern 1103 in a contact portion B, whereby both the wiring patterns are electrically connected to each other.

In the surface acoustic wave device 1101 of the comparative example, the first multilayer electrically conductive film 1102 has a structure of AlCu alloy film 1102a/Ti film 1102b/Pt film 1102c/NiCr alloy film 1102d=140/10/85/10 (in units of nm) in which these films are stacked from the top in that order so as to have the above thicknesses. The AlCu alloy film 1102a is an AlCu alloy film containing 1 weight percent Cu and the balance of Al as in the first preferred embodiment. Furthermore, the NiCr alloy film 1102d is the same as the NiCr alloy film used in the above preferred embodiment.

The second multilayer electrically conductive film 1104 has a structure in which an Al film 1104a, a Ti film 1104b, and an AlCu alloy film 1104c are stacked from the top in that order so that the films have the thicknesses of Al/Ti/AlCu alloy=1140/200/500 (in units of nm). The AlCu alloy film 1104c is an AlCu alloy film containing 10 weight percent Cu and the balance of Al. That is, the second multilayer electrically conductive film 1104 is formed in the same manner as the second multilayer electrically conductive film of the above preferred embodiment. Accordingly, also in the surface acoustic wave device 1101 of this comparative example, even when bonding is performed using the bump 32 in the flip-chip bonding, cracks are not readily formed in the piezoelectric substrate 2.

Turning now to the contact portion B, the top electrically conductive film of the first multilayer electrically conductive film 1102 is the AlCu alloy film 1102a, which is an electrically conductive film mainly containing Al. The AlCu alloy film 1104c, which is the bottom electrically conductive film of the second multilayer electrically conductive film 1104, overlaps this AlCu alloy film 1102a. Accordingly, the interface of these two multilayer electrically conductive films is the AlCu alloy film 1104c/AlCu alloy film 1102a.

Figure 6A:
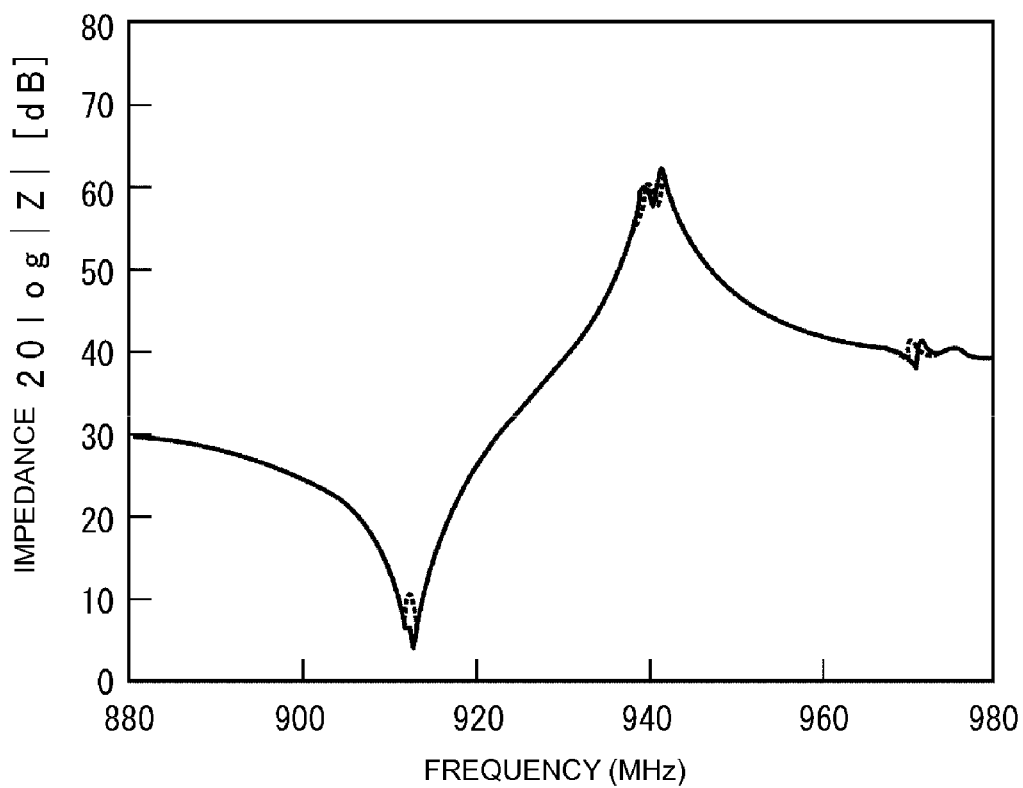
FIG. 6A is a graph of an impedance-frequency characteristic of series arm resonators of elastic wave devices of the first preferred embodiment of the present invention and the comparative example.
Figure 6B:
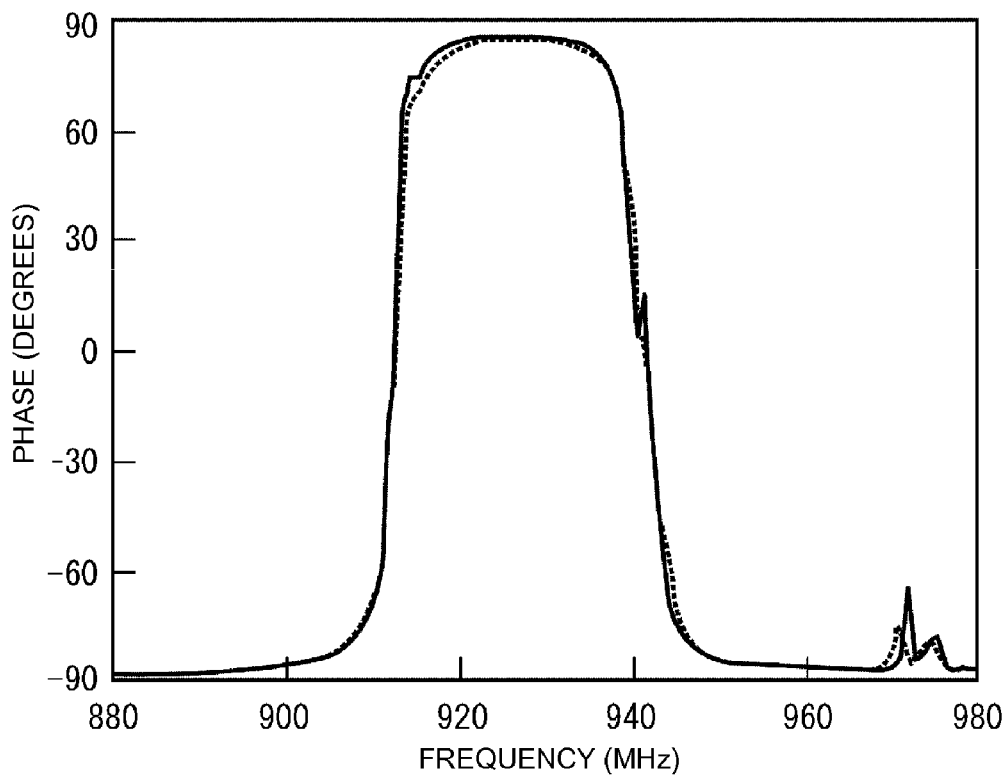
FIG. 6B is a graph of a phase-frequency characteristic thereof.
Figure 7:
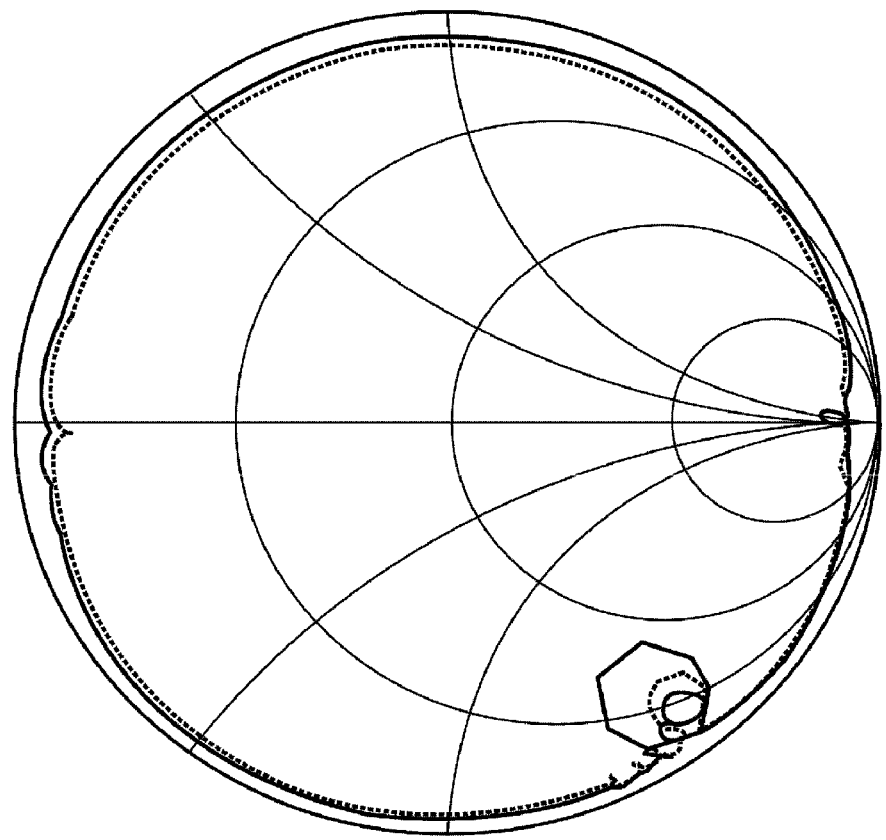
FIG. 7 is an impedance Smith chart of the series arm resonator of the first preferred embodiment of the present invention and the series arm resonator of the comparative example.
Figure 8:
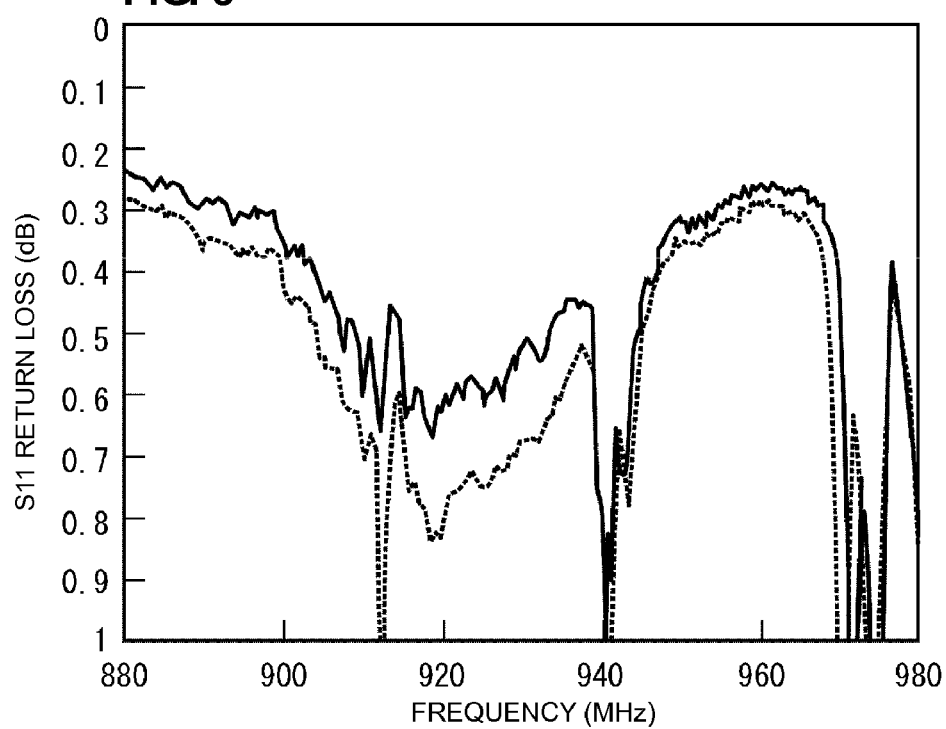
FIG. 8 is a graph showing a return loss of a reflection characteristic S11 of the series arm resonators of the elastic wave devices of the first preferred embodiment of the present invention and the comparative example.

FIG. 6A shows an impedance-frequency characteristic of the series arm resonators S1 of the surface acoustic wave device of the above preferred embodiment and the surface acoustic wave device 1101 of the comparative example, and FIG. 6B shows a phase-frequency characteristic thereof. FIG. 7 is an impedance Smith chart of the series arm resonators S1 of the surface acoustic wave device 1 of the above preferred embodiment and the surface acoustic wave device 1101 of the comparative example. FIG. 8 is a graph showing a return loss of the coefficient S11 of reflection of each of the series arm resonators. In FIGS. 6A and 6B to FIG. 8, the solid lines show the results of the present preferred embodiment of the present invention and the broken lines show the results of the comparative example.

As is apparent from FIGS. 6A and 6B to FIG. 8, in particular, as is clearly apparent from FIG. 7 showing the impedance Smith chart and FIG. 8 showing the return loss, according to the present preferred embodiment of the present invention, the insertion loss can be reduced in a frequency range between the resonance point and the anti-resonance point, that is, in a frequency range used as a pass band as compared with the comparative example.

In addition, FIG. 8 shows that the return loss in a shoulder at the high-frequency side of the filter pass band, that is, in the range of about 910 MHz to about 930 MHz is reduced as compared with the comparative example.

This is because the contact resistance in the contact area B where the second wiring pattern and the first wiring pattern are connected to each other is decreased.

Accordingly, according to the surface acoustic wave device 1 of this preferred embodiment, the insertion loss can be reduced as compared with the surface acoustic wave device 1101 of the comparative example.

Figure 9:
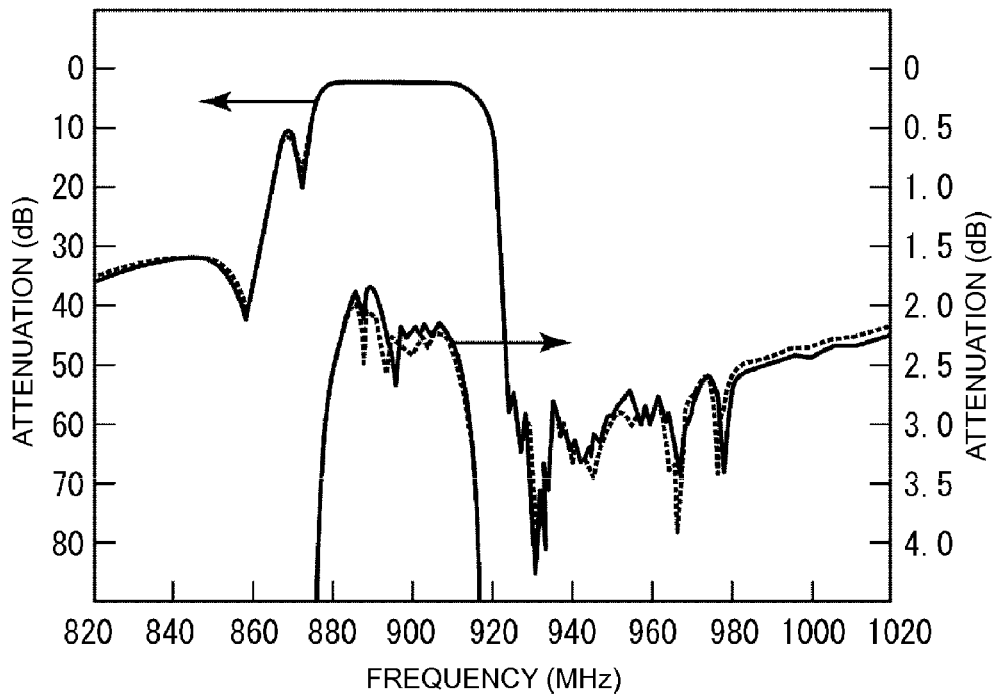
FIG. 9 is a graph showing an attenuation-frequency characteristic of the elastic wave device of the first preferred embodiment of the present invention and the elastic wave device of the comparative example.

FIG. 9 is a graph showing an attenuation-frequency characteristic of the surface acoustic wave device 1 of the first preferred embodiment and the surface acoustic wave device 1101 of the comparative example. The solid lines show the results of the preferred embodiment and the broken lines show the results of the comparative example. As is apparent from FIG. 9, according to the first preferred embodiment, the minimum insertion loss can be improved by about 0.18 dB as compared with the comparative example.

Furthermore, in the surface acoustic wave device 1 of the above preferred embodiment, the insertion loss can be further improved by conducting an annealing treatment by heating in the production process. This will be described with reference to FIGS. 10 and 11.

Figure 10:
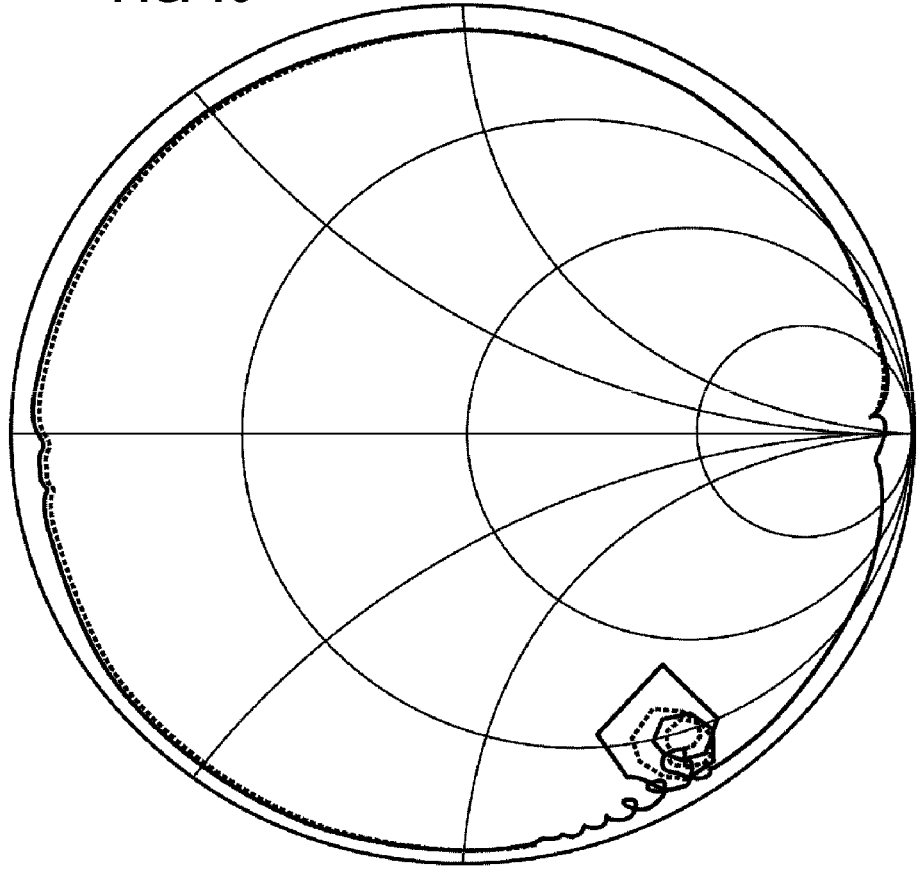
FIG. 10 is an impedance Smith chart of series arm resonators in the cases where an annealing treatment was conducted and the annealing treatment was not conducted in the elastic wave device of the first preferred embodiment of the present invention.
Figure 11:
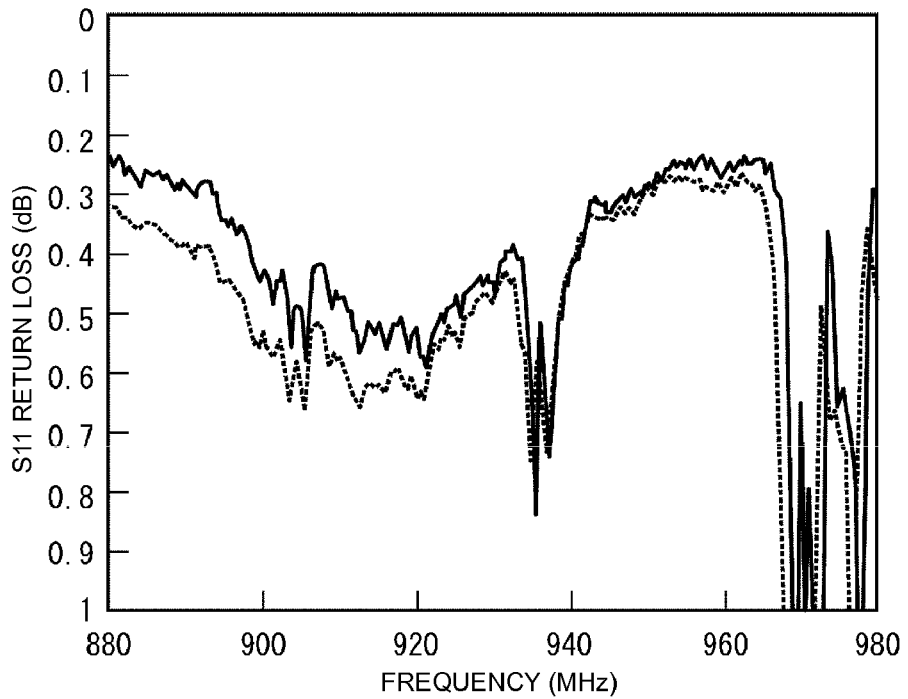
FIG. 11 is a graph showing a return loss of a reflection characteristic S11 of series arm resonators in the cases where the annealing treatment was conducted and the annealing treatment was not conducted in the elastic wave device of the first preferred embodiment of the present invention.

FIG. 10 shows an impedance Smith chart of a series arm resonator in the case where an annealing treatment was conducted at a temperature of about 280° C. for about 60 minutes and an impedance Smith chart of a series arm resonator in the case where the annealing treatment was not conducted in producing the surface acoustic wave device of the above preferred embodiment. FIG. 11 is a graph showing a return loss of a reflection characteristic of the series arm resonator in the case where the annealing treatment was conducted and a return loss of a reflection characteristic of the series arm resonator in the case where the annealing treatment was not conducted. The solid line shows the characteristic after the annealing, and the broken line shows the characteristic in the case where the annealing treatment was not conducted.

As is apparent from FIGS. 10 and 11, it is seen that the resonator characteristics are improved by conducting an annealing treatment, and the insertion loss can be further decreased.

This annealing treatment is a heating treatment conducted after forming the electrode structure of the surface acoustic wave device 1 in the form of a wafer and forming the insulating film 24, and before dicing the wafer into surface acoustic wave filter chips. This heating can be performed by a method in which a wafer is made to pass through an annealing furnace, a method in which heating is performed using a proper heater, or the like. The temperature and the time of the annealing treatment are different depending on the wafer and the electrode used, but appropriate conditions can be used as long as an oxide layer of the Al-based electrically conductive film, which is the top layer of the first multilayer electrically conductive film, can be reduced. For example, the annealing treatment may be performed while maintaining a temperature in the range of about 230° C. to about 280° C. for about 60 to 360 minutes, for example.

The top electrically conductive film of the first multilayer electrically conductive film is composed of Al or an alloy mainly containing Al. Accordingly, even when the top electrically conductive film has an oxide layer on the surface thereof, the oxide layer is reduced by the annealing treatment, whereby the contact resistance can be reduced.

Figure 12:
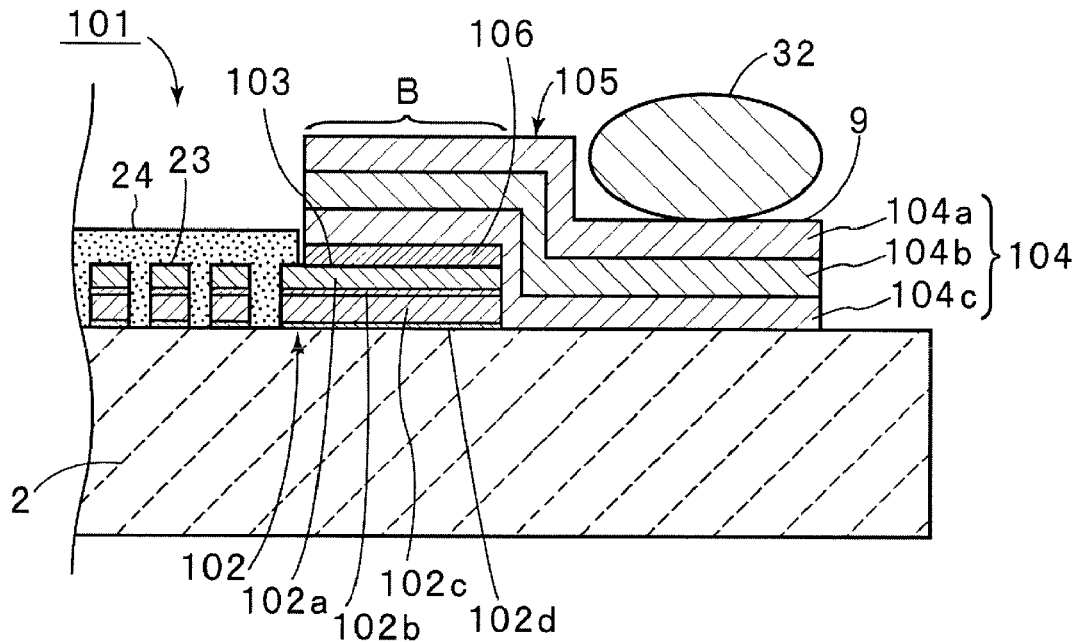
FIG. 12 is a cross-sectional view showing the relevant portion of an elastic wave device of a second preferred embodiment of the present invention.

FIG. 12 is a schematic front cross-sectional view showing the relevant portion of an elastic wave device according to a second preferred embodiment of the present invention. A surface acoustic wave device 101 is preferably the same as the surface acoustic wave device 1 of the first preferred embodiment except that the structure of the first multilayer electrically conductive film and the structure of the contact portion are different from those of the surface acoustic wave device 1 of the first preferred embodiment. Accordingly, the different parts will be mainly described with reference to FIG. 12, and a description of the other parts is omitted since they were described in the first preferred embodiment.

In the surface acoustic wave device 101, a first multilayer electrically conductive film 102 and a second multilayer electrically conductive film 104 are provided on a piezoelectric substrate 2. The first multilayer electrically conductive film 102 is used for forming an IDT, a reflector 23, and a first wiring pattern 103 leading to the IDT and the reflector 23. On the other hand, the second multilayer electrically conductive film 104 is used for forming an electrode pad 9 and a second wiring pattern 105 leading to the electrode pad 9. Bonding is performed on the electrode pad 9 using a bump 32.

In this preferred embodiment, an interlayer electrically conductive film 106 is stacked in a contact portion B where the first wiring pattern 103 and the second wiring pattern 105 are stacked so as to be electrically connected to each other.

The first multilayer electrically conductive film 102 preferably has a structure in which an AlCu alloy film 102a, a Ti film 102b, a Pt film 102c, and a NiCr alloy film 102d are stacked from the top in that order. The approximate thicknesses of the electrically conductive films are AlCu alloy/Ti/Pt/NiCr alloy=140/10/85/10 (in units of nm), for example. Accordingly, main electrode layers are the AlCu alloy film 102a preferably having a thickness of about 140 nm and the Pt film 102c preferably having a thickness of about 85 nm, for example.

Accordingly, the Pt film 102c, which is other than Cu, Au, and Ag and which has a higher density than Al, is provided as a main electrode layer, and thus excellent electrical power resistance and oxidation resistance can be provided.

The AlCu alloy film 102a preferably is composed of an Al alloy containing about 1 weight percent Cu and the balance of Al, for example. Accordingly, excellent oxidation resistance can be provided.

On the other hand, the second multilayer electrically conductive film 104 has a structure in which an Al film 104a, a Ti film 104b, and an AlCu alloy film 104c are stacked from the top in that order. The approximate thicknesses thereof are Al/Ti/AlCu alloy=1140/200/500 (in units of nm), for example. Accordingly, the Al film 104a preferably having a thickness of about 1,140 nm and the AlCu alloy film 104c preferably having a thickness of about 500 nm are main electrode layers, for example. The Ti film 104b is a barrier layer.

Note that the AlCu alloy film 104c is composed of an Al alloy film containing about 10 weight percent Cu and the balance of Al, for example.

The interlayer electrically conductive film 106 is composed of Ti, and the thickness thereof preferably is about 100 nm, for example, in this preferred embodiment. Note that the thickness of the interlayer electrically conductive film 106 is not limited to about 100 nm, and the interlayer electrically conductive film 106 satisfactorily functions as an interlayer electrically conductive film as long as the thickness thereof is about 5 nm or more. If the thickness of the interlayer electrically conductive film 106 is too large, the electrical resistance may increase. Accordingly, the thickness of the interlayer electrically conductive film 106 is preferably about 200 nm or less, for example.

Also in this preferred embodiment, since the bottom electrically conductive film in the electrode pad 9 is the AlCu alloy film 104c described above, that is, since the bottom electrically conductive film is composed of an Al alloy film, the bottom electrically conductive film is relatively soft. Consequently, during flip-chip bonding using the bump 32, cracks are not readily formed in the piezoelectric substrate 2.

In addition, in the contact portion B, the second wiring pattern 105 is overlapped on the first wiring pattern 103 to establish electrical connection. Here, the interlayer electrically conductive film 106 is disposed between the AlCu alloy film 104c, which is disposed at the bottom of the second multilayer electrically conductive film 104, and the AlCu alloy film 102a, which is the top electrically conductive film of the first multilayer electrically conductive film 102. Accordingly, an interface at which Al-based films are in contact with each other is not present. Consequently, also in this preferred embodiment, the contact resistance in the contact portion can be reduced, whereby the insertion loss can be improved. This will be described with reference to FIGS. 13 and 14.

Figure 13:
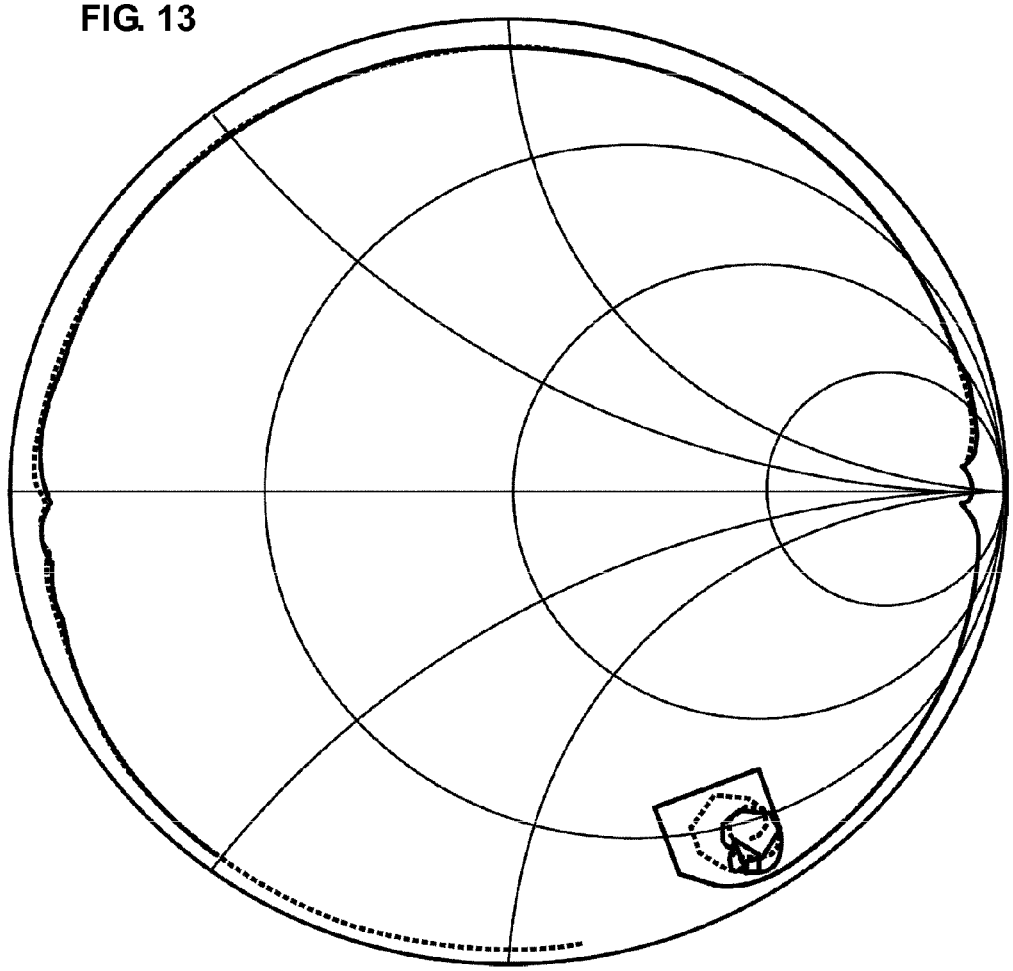
FIG. 13 is an impedance Smith chart of a series arm resonator of the elastic wave device of the second preferred embodiment of the present invention and the series arm resonator of the elastic wave device of the comparative example.
Figure 14:
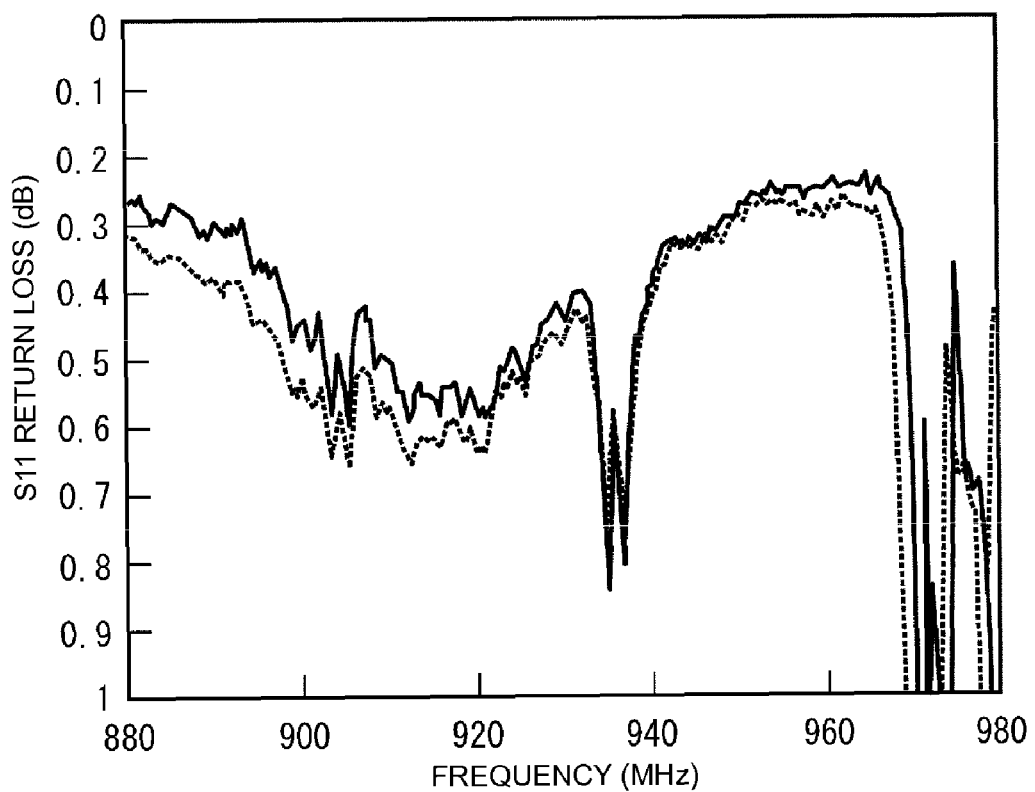
FIG. 14 is a graph showing a return loss of a reflection characteristic S11 of the series arm resonators of the elastic wave devices of the second preferred embodiment of the present invention and the comparative example.

FIG. 13 is an impedance Smith chart of series arm resonators S1 of the surface acoustic wave device 101 of the second preferred embodiment and the surface acoustic wave device 1101 of the comparative example described above. FIG. 14 is a graph showing a return loss of a reflection characteristic S11 of each of the series arm resonators. Note that, in FIGS. 13 and 14, the solid lines show the results of the second preferred embodiment and the broken lines show the results of the comparative example. As is apparent from FIGS. 13 and 14, the insertion loss can be reduced also in the second preferred embodiment as compared with the comparative example.

Figure 15:
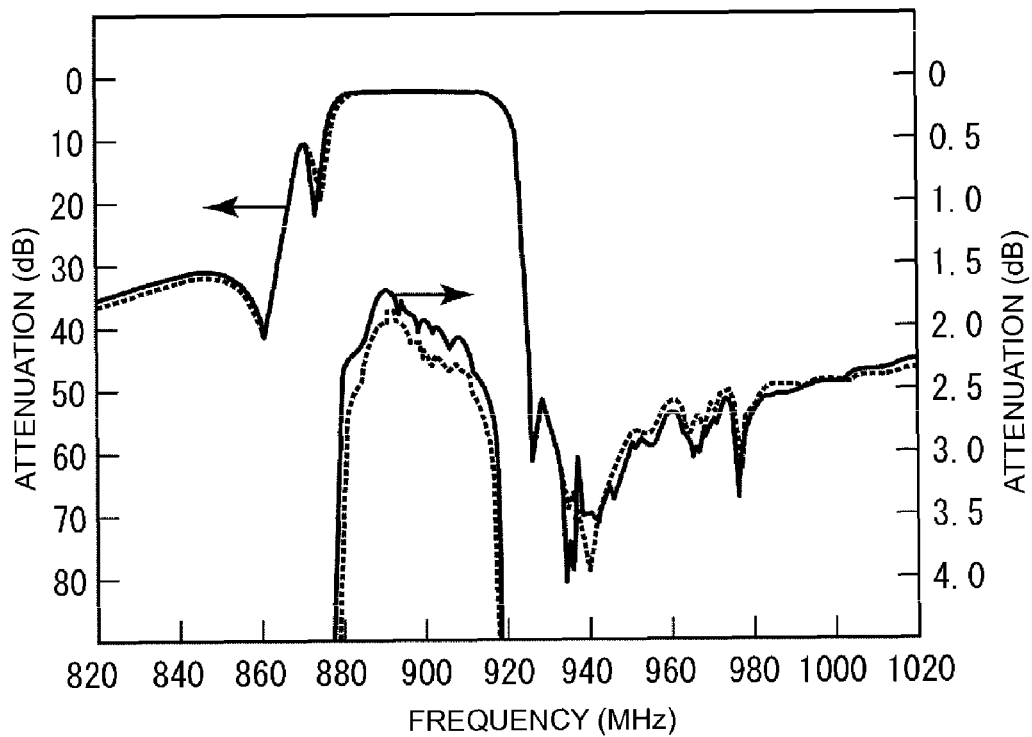
FIG. 15 is a graph showing an attenuation-frequency characteristic of the elastic wave device of the second preferred embodiment of the present invention and the elastic wave device of the comparative example.

FIG. 15 is a graph showing an attenuation-frequency characteristic of the surface acoustic wave devices of the second preferred embodiment and the comparative example. The solid lines show the results of the second preferred embodiment and the broken lines show the results of the comparative example. As is apparent from FIG. 15, according to the second preferred embodiment, the minimum insertion loss can be improved by about 0.16 dB as compared with the comparative example.

Furthermore, in the second preferred embodiment in which the interlayer electrically conductive film 106 is provided, the insertion loss can be further improved by conducting an annealing treatment by heating. This will be described with reference to FIGS. 16 and 17.

Figure 16:
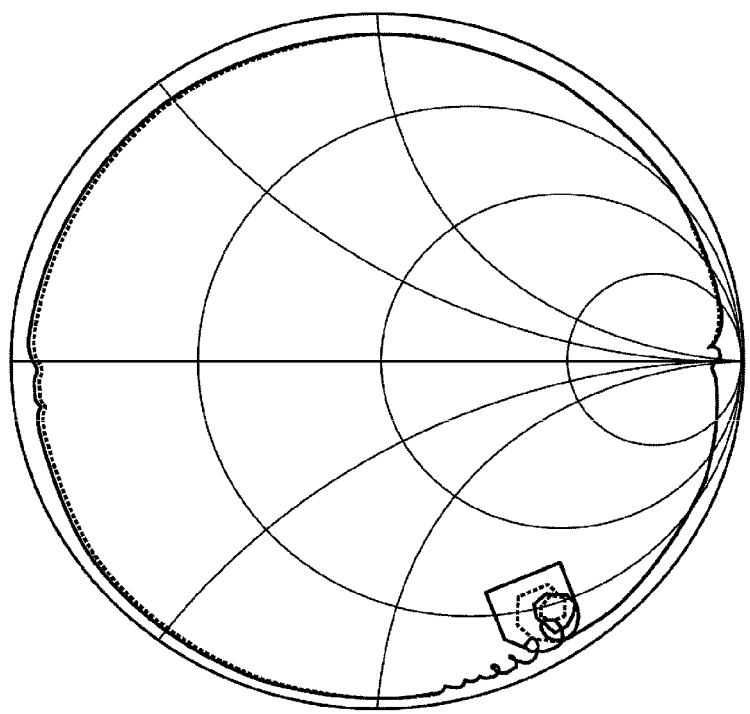
FIG. 16 is an impedance Smith chart of series arm resonators in the cases where an annealing treatment was conducted and the annealing treatment was not conducted in the elastic wave device of the second preferred embodiment of the present invention.
Figure 17:
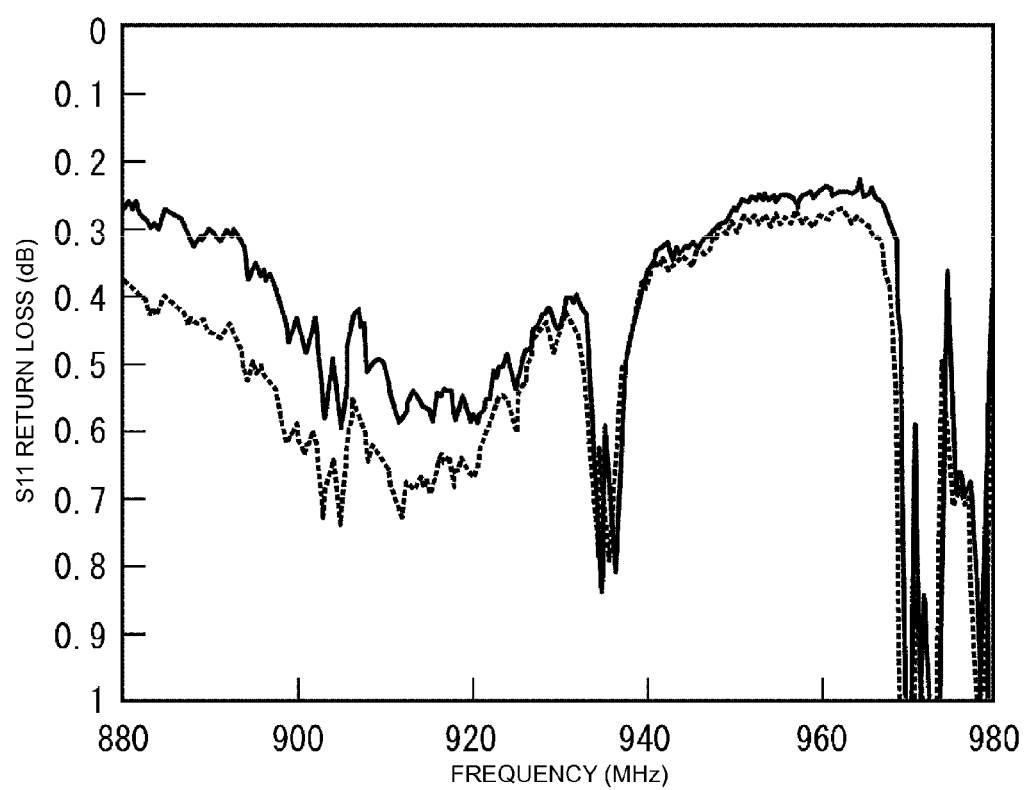
FIG. 17 is a graph showing a return loss of a reflection characteristic S11 of series arm resonators in the cases where the annealing treatment was conducted and the annealing treatment was not conducted in the elastic wave device of the second preferred embodiment of the present invention.

FIG. 16 is an impedance Smith chart of a series arm resonator in the case where an annealing treatment was conducted at a temperature of about 280° C. for about one hour, for example, and a series arm resonator in the case where the annealing treatment was not conducted in producing the surface acoustic wave device 101 of the second preferred embodiment. FIG. 17 is a graph showing a return loss of a reflection characteristic in the cases where the annealing treatment was conducted and the annealing treatment was not conducted. The solid lines show the characteristics after the annealing treatment and the broken lines show the characteristics in the case where the annealing treatment was not conducted.

As is apparent from FIGS. 16 and 17, the insertion loss can be further reduced by conducting the above annealing treatment.

As a third preferred embodiment, a surface acoustic wave device similar to the surface acoustic wave device 101 of the second preferred embodiment was prepared. In the preparation of the surface acoustic wave device of the third preferred embodiment, a $SiO_2$ film having a thickness of about 220 nm was formed on a $LiNbO_3$ substrate having a cut angle of 126°, for example, and portions of the $SiO_2$ film on which an IDT and reflectors were to be formed were etched. Subsequently, metal films were formed to form a first multilayer electrically conductive film. The first multilayer electrically conductive film included an AlCu alloy film, a Ti film, a Pt film, and a NiCr alloy film from the top in that order, and these films had approximate thicknesses of 140/10/85/10 (in units of nm), respectively, for example. The AlCu alloy film used preferably had a composition containing about 1 weight percent Cu and the balance of Al, for example. The NiCr alloy film was the same as the NiCr alloy film used in the first preferred embodiment. The electrode finger pitch of the IDT was about 2 μm, and the duty thereof was about 0.5, for example. The second multilayer electrically conductive film was the same as that in the first preferred embodiment. A $SiO_2$ film was further formed so as to have a thickness of about 1,000 nm, and a SiN film for adjusting the frequency was then formed so as to have a thickness of about 50 nm, for example, thus forming an insulating film 24.

Note that the cut angle of the $LiNbO_3$ substrate may be about 124° to about 128°, the thickness of the Pt film may be about 70 nm to about 90 nm, and the thickness of the AlCu alloy film may be about 80 nm to about 140 nm, for example. The IDT is arranged so that surface acoustic waves propagate in the X-axis direction on a plane which is rotated by the above cut angle with respect to the X-axis serving as a rotation axis and in which the Y-axis serves as a normal line.

According to the third preferred embodiment, since Cu is not used in the IDT, the degradation of characteristics due to oxidation does not readily occur. Consequently, weather-resistant reliability can also be increased.

Figure 18:
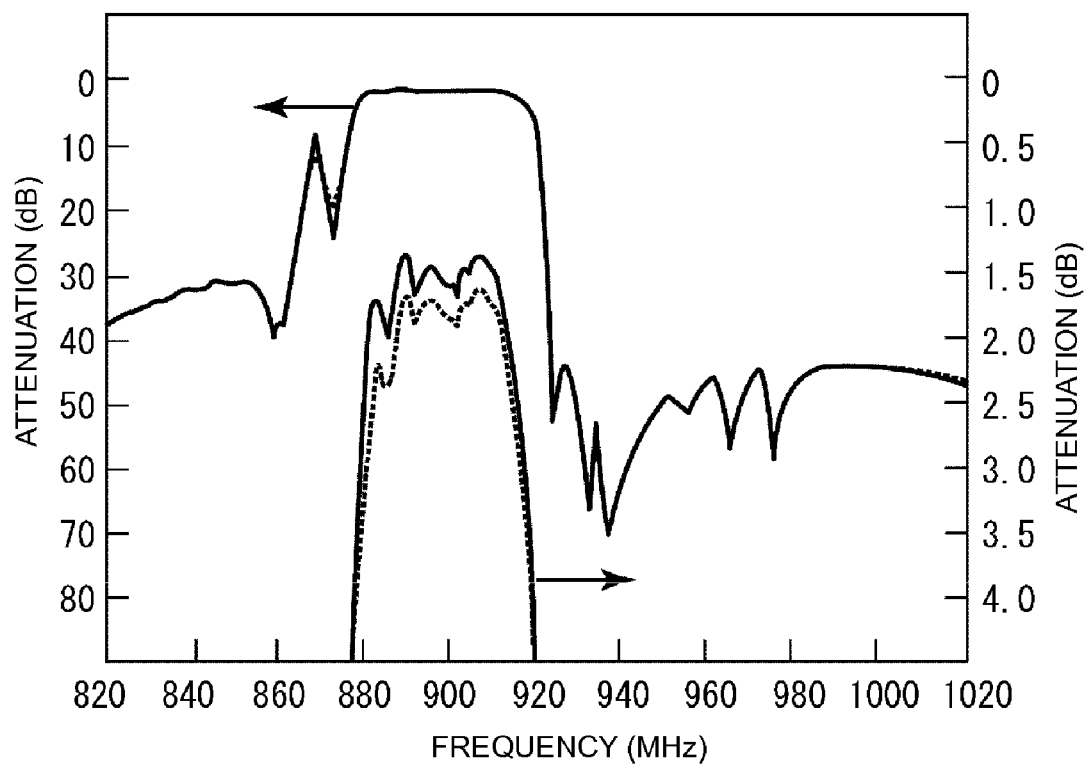
FIG. 18 is a graph showing an attenuation-frequency characteristic of an elastic wave device of a third preferred embodiment of the present invention and an elastic wave device of a second comparative example.

Next, a surface acoustic wave device of a second comparative example was prepared to compare with the surface acoustic wave device of the third preferred embodiment. The surface acoustic wave device of the second comparative example was prepared as in the third preferred embodiment except that a Pt film in which a Ti film a Pt film, and a NiCr alloy film which had the thicknesses of approximately 10 nm, 100 nm, and 10 nm, respectively, were deposited from the top in that order was used in accordance with a conventional example instead of the first multilayer electrically conductive film. FIG. 18 is a graph showing an attenuation-frequency characteristic of the surface acoustic wave device of the third preferred embodiment and the surface acoustic wave device of the second comparative example. As is apparent from FIG. 18, according to the third preferred embodiment, the minimum insertion loss can be improved by about 0.26 dB as compared with the second comparative example.

This is an effect of a reduction in the ohmic loss due to the addition of the AlCu alloy film to the IDT.

A configuration in which a high-density metal having a higher density than Al is used as an IDT is a known technology with which a sufficient coefficient of reflection can be obtained. In addition to Pt, examples of metals having a higher density than Al, which has a density of about 2,699 (kg/m$^3$), include Au, Cu, Ta, W, Ag, Ni, Mo, NiCr, Cr, and Ti. However, Cu and Ag are easily oxidized. Also, in the case of Au, the electrical power resistance becomes low. Therefore, the high-density metals other than Cu, Ag, and Au are preferably used.

However, all the high-density metals other than Cu and Ag, which are easily oxidized, and Au, which is disadvantageous in terms of the electrical power resistance, are metals having a high specific resistance. Accordingly, when only a metal having a high density is used as a main electrode, loss is degraded by an increase in the ohmic loss. In contrast, in various preferred embodiments of the present invention, by combining a metal having a low specific resistance, such as Al, with a metal having a high density, such as Pt, the ohmic loss can be reduced while maintaining a sufficient coefficient of reflection. As the metal having a high density, metals having a density of about 10,000 (kg/m$^3$) or more, for example, Pt having a density of about 21,400 (kg/m$^3$), Ta having a density of about 16,678 (kg/m$^3$), W having a density of about 19,265 (kg/m$^3$), and Mo having a density of about 10,219 (kg/m$^3$) are preferable, for example. In particular, Pt, which has a melting point of 2,000° C. or lower, is further preferable because a film of Pt can be easily formed by vapor deposition.

A method of forming each of the electrically conductive films is not particularly limited. The electrically conductive films can be formed by appropriately employing an etching method, lift-off, or the like. FIGS. 19A-19G are each a schematic front cross-sectional view showing a preferred embodiment of a method of forming the first multilayer electrically conductive film and the second multilayer electrically conductive film in the surface acoustic wave device of the first preferred embodiment.

Figure 19A:
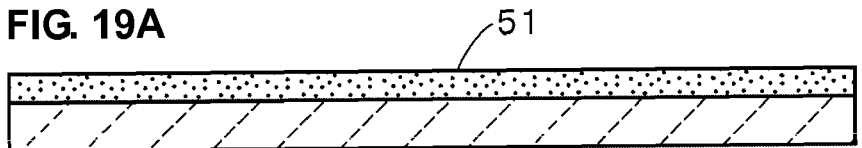
FIGS. 19A to 19G are each a schematic cross-sectional view illustrating a method of producing the elastic wave device of the first preferred embodiment of the present invention.

First, as shown in FIG. 19A, a first resist pattern 51 is formed on a piezoelectric substrate 2 by applying a resist.

Figure 19B:
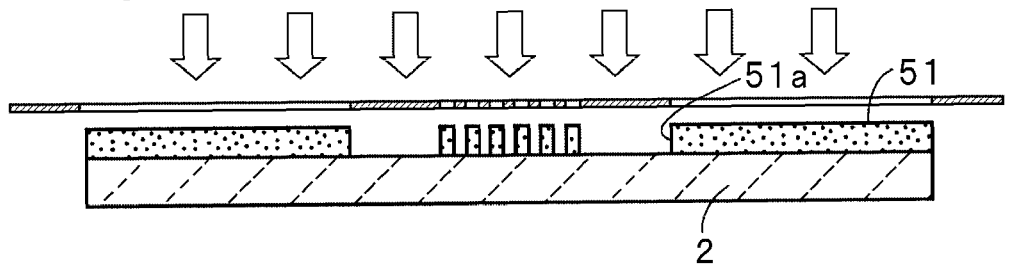

Next, as shown in FIG. 19B, an opening 51a is formed in the first resist pattern 51 by a photolithography method. The opening 51a corresponds to a portion where a first multilayer electrically conductive film is to be formed.

Figure 19C:
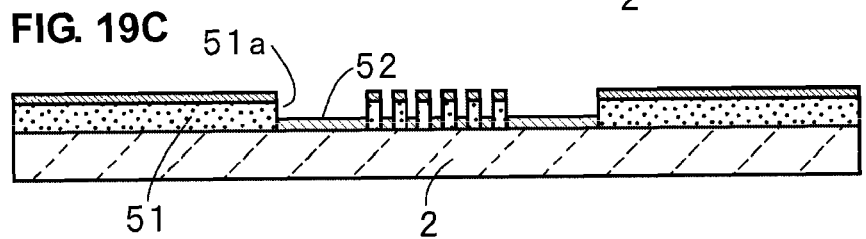

Next, as shown in FIG. 19C, a first multilayer electrically conductive film 52 is formed. The first multilayer electrically conductive film 52 is shown as a single electrically conductive film in FIG. 19C, but a plurality of electrically conductive layers are sequentially stacked as in the above-described first preferred embodiment. Each of the electrically conductive layers can be formed by an appropriate method of forming a thin film, such as vapor deposition, plating, or sputtering.

Figure 19D:
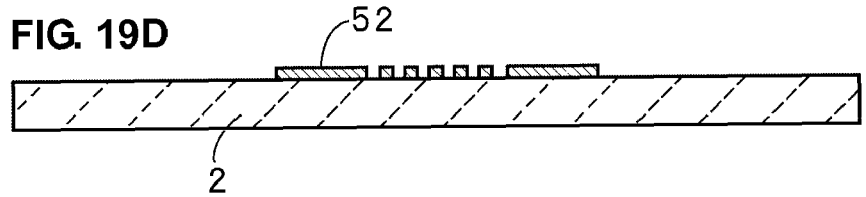
Figure 19E:
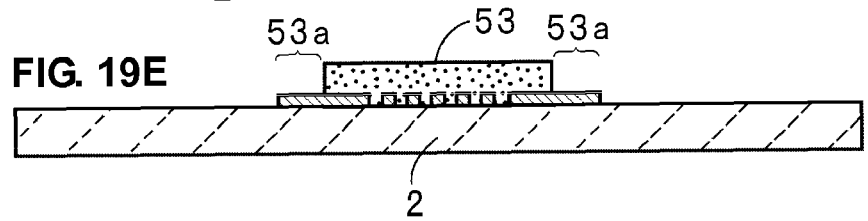
Figure 19F:
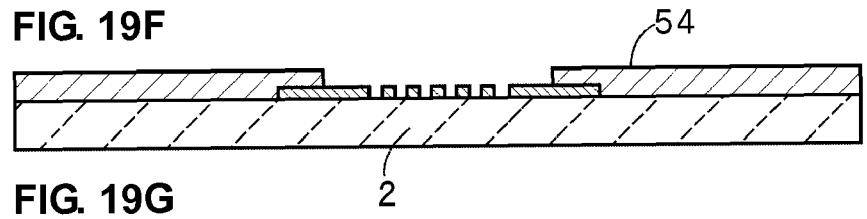
Figure 19G:
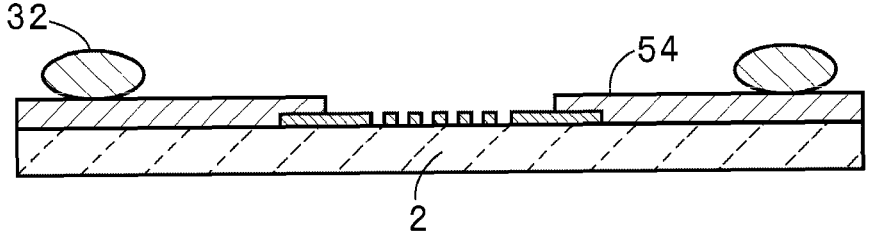

Subsequently, as shown in FIG. 19D, the first resist pattern 51 is removed using a solvent. Specifically, unnecessary metal films on the first resist pattern 51 are also removed by lift-off at the same time. Thus, as shown in FIG. 19D, the first multilayer electrically conductive film 52 can be formed on the piezoelectric substrate 2. This first multilayer electrically conductive film 52 forms the IDT electrode, the reflectors, and the first wiring pattern described above. Subsequently, as shown in FIG. 19E, a second resist pattern 53 is formed so that an opening 53a has an opening in a portion where a second multilayer electrically conductive film is to be formed. Next, a second multilayer electrically conductive film 54 shown in FIG. 19F is formed so as to have a contact portion B, and the second resist pattern 53 and unnecessary metal films are removed by lift-off. Subsequently, bumps 32 are bonded as shown in FIG. 19G.

FIGS. 20A-20E are schematic front cross-sectional views illustrating steps of forming the first and second multilayer electrically conductive films and the interlayer electrically conductive film in the second preferred embodiment.

Figure 20A:
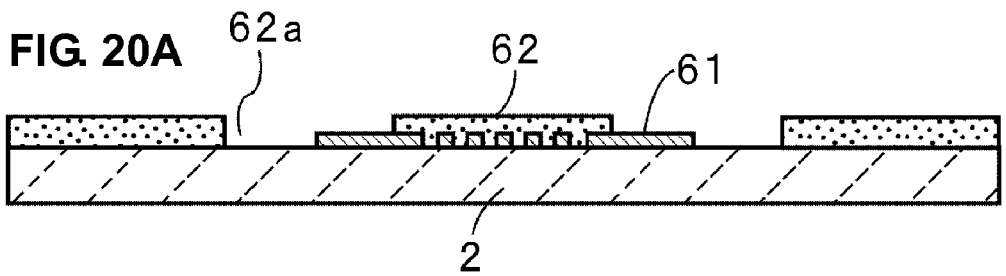
FIGS. 20A to 20E are each a schematic cross-sectional view illustrating a method of producing the elastic wave device of the second preferred embodiment of the present invention.
Figure 20B:
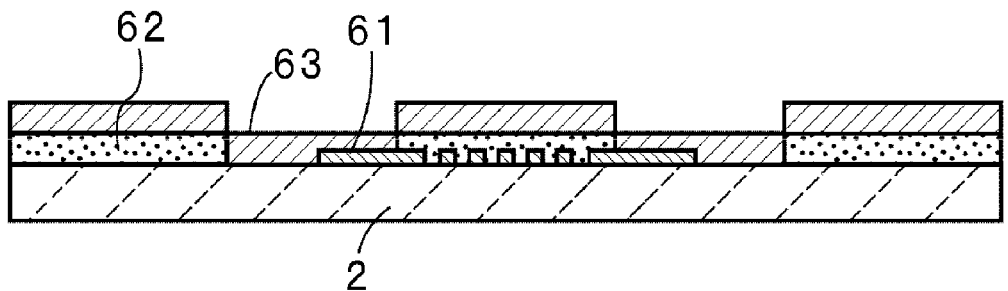
Figure 20C:
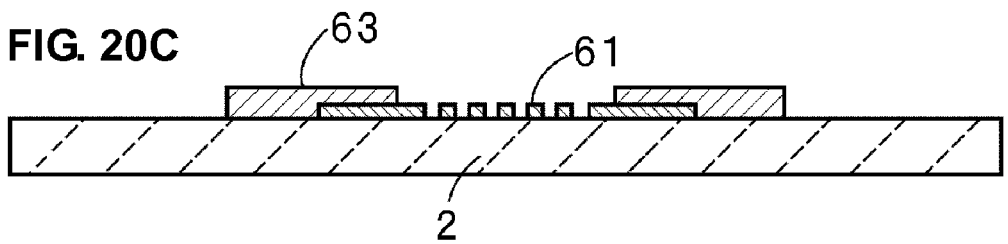

Also in the second preferred embodiment, as in the production method of the first preferred embodiment, a first resist pattern, which is not shown in the figure, is formed on a piezoelectric substrate 2, electrically conductive films forming the first multilayer electrically conductive film are then sequentially formed, and the first resist pattern and unnecessary metal films are removed by a lift-off method. Thus, a first multilayer electrically conductive film 61 shown in FIG. 20A is formed. Subsequently, as shown in FIG. 20B, a second resist pattern 62 having an opening located in a portion where an interlayer electrically conductive film is to be formed is formed. A Ti film for forming an interlayer electrically conductive film 63 is formed on the entire surface. Subsequently, the interlayer electrically conductive film 63 is formed by removing the second resist pattern 62 and unnecessary portions of the Ti film on the second resist pattern 62 by lift-off.

Figure 20D:
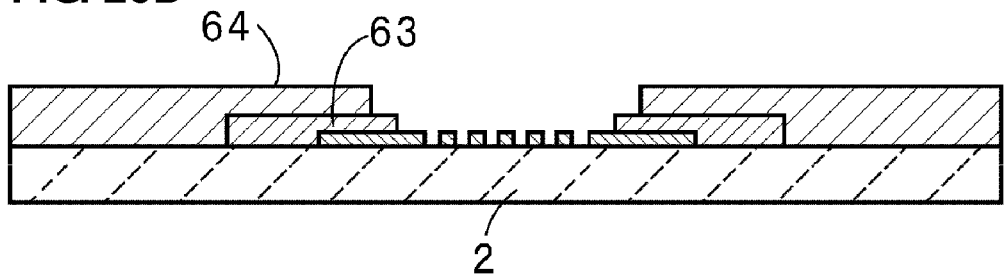
Figure 20E:
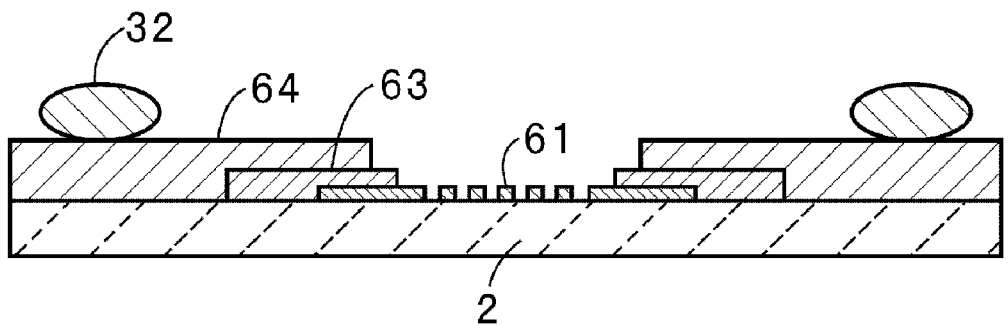

Subsequently, as shown in FIG. 20D, a second multilayer electrically conductive film 64 is formed so as to cover at least a portion of the interlayer electrically conductive film 63 and to form a contact portion B. The second multilayer electrically conductive film 64 can be formed in the same manner as the second multilayer electrically conductive film of the first preferred embodiment. Here, the interlayer electrically conductive film 63 composed of Ti has been formed using the second resist pattern 62. Therefore, a resist pattern having an opening located in a portion where the second multilayer electrically conductive film 64 is to be formed is formed as a third resist pattern, and the same method is then performed. Subsequently, bumps 32 are formed on the second multilayer electrically conductive film 64 as shown in FIG. 20E.

Figure 21:
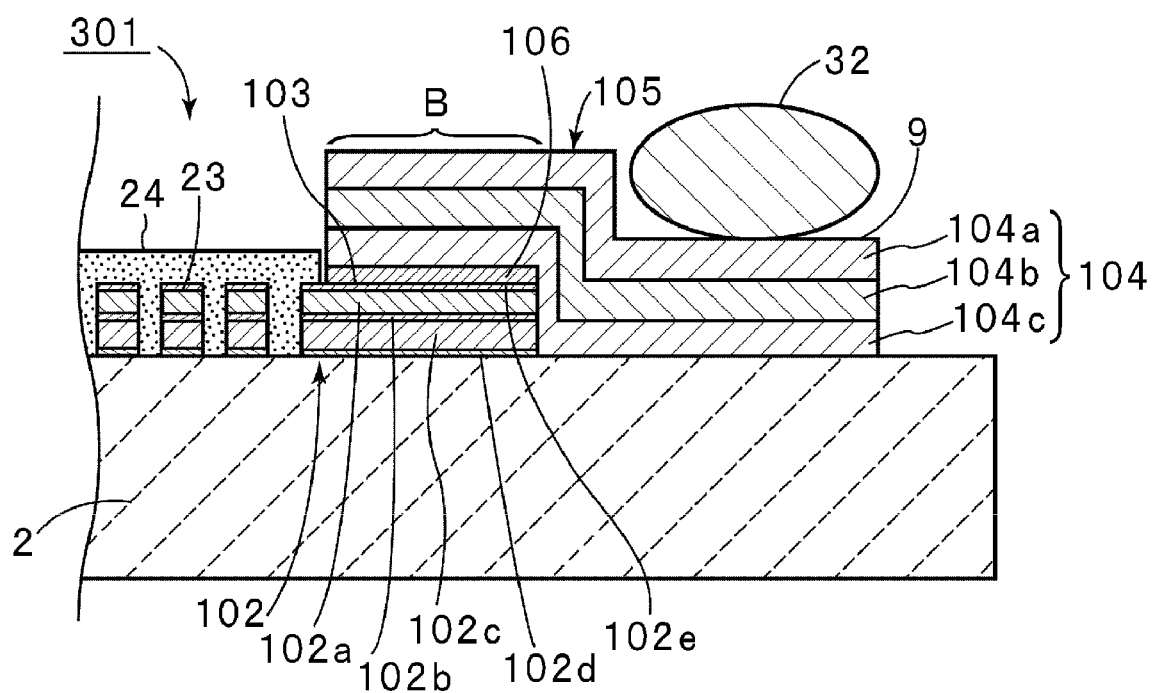
FIG. 21 is a cross-sectional view showing the relevant portion of an elastic wave device of a fourth preferred embodiment of the present invention.

FIG. 21 is a partially cutaway front cross-sectional view illustrating the relevant portion of a surface acoustic wave device according to a fourth preferred embodiment of the present invention and is a view corresponding to FIG. 12 described in the second preferred embodiment. A surface acoustic wave device 301 of the fourth preferred embodiment is preferably the same as the surface acoustic wave device of the second preferred embodiment except that a first multilayer electrically conductive film 102 includes a Ti film 102e at the top thereof. Accordingly, the same elements are assigned the same reference numerals, and a description thereof is omitted. In this preferred embodiment, the first multilayer electrically conductive film 102 has a structure in which a Ti film 102e, a AlCu alloy film 102a, a Ti film 102b, a Pt film 102c, and a NiCr alloy film 102d are stacked from the top in that order. The thickness of the Ti film 102e preferably is about 10 nm in the case where the other electrically conductive films are the same as those in the second preferred embodiment.

A second multilayer electrically conductive film 104 has a structure in which an Al film 104a, a Ti film 104b, and an AlCu alloy film 104c are stacked from the top in that order, as in the second preferred embodiment, and the thicknesses thereof are preferably the same as those in the second preferred embodiment. Accordingly, this preferred embodiment has an effect of reliably preventing cracks of the piezoelectric substrate 2 as in the second preferred embodiment. Furthermore, since the Ti film 102e is provided on the top of the first multilayer electrically conductive film 102, the surface of the AlCu alloy film 102a, which is a main electrode layer, is protected by the Ti film 102e. For example, in the formation of the interlayer electrically conductive film 106 and the second multilayer electrically conductive film 104, a developer and the like are used, but the AlCu alloy film 102a does not tend to be damaged by the developer and the like. Accordingly, the degradation of electrical characteristics can be prevented.

In addition, in a contact portion B, an interlayer electrically conductive film 106 composed of a Ti film is disposed between the AlCu alloy film 104c, which is the Al-based bottom electrically conductive film of the second multilayer electrically conductive film 104, and the Ti film, which is the top electrically conductive film of the first multilayer electrically conductive film 102. The thickness of the interlayer electrically conductive film 106 is preferably about 100 nm as in the second preferred embodiment. As in the second preferred embodiment, the contact resistance can be reduced. Consequently, the insertion loss of the surface acoustic wave device 301 can be further improved. Note that the thickness of the Ti film 106 is not limited to about 100 nm as in the second preferred embodiment.

In the first to fourth preferred embodiments, descriptions have been made of examples in which the surface acoustic wave device of the present invention is applied to the transmission filter of the duplexer for a mobile phone shown in FIG. 3. However, the surface acoustic wave device according to various preferred embodiments of the present invention can be widely used not only in a transmission filter for a mobile phone but also in various band-pass filters, elastic wave resonators, and the like.

Figure 22A:
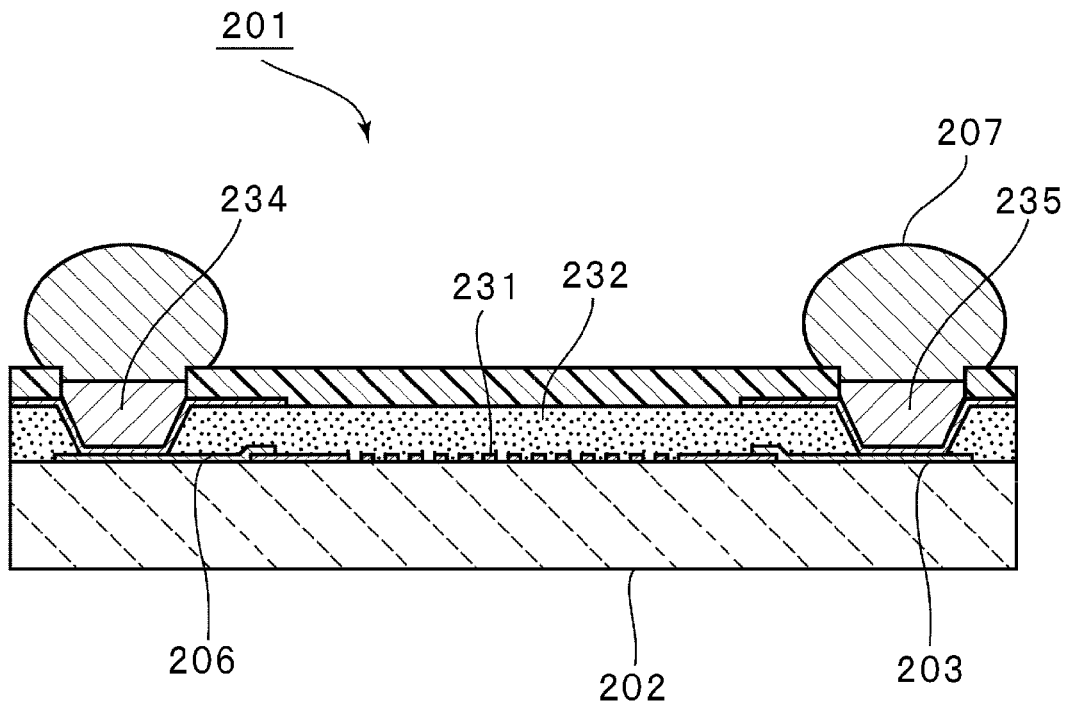
FIG. 22A is a front cross-sectional view that schematically shows an example of an elastic boundary wave device to which a preferred embodiment of the present invention is applied.
Figure 22B:
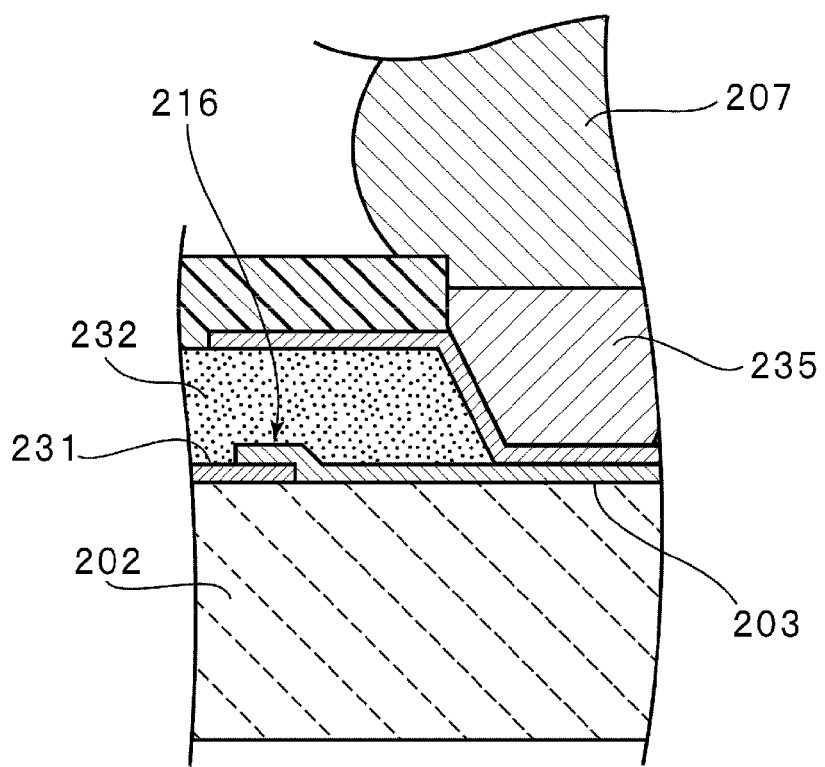
FIG. 22B is a schematic front cross-sectional view showing the relevant portion thereof.
Figure 23:
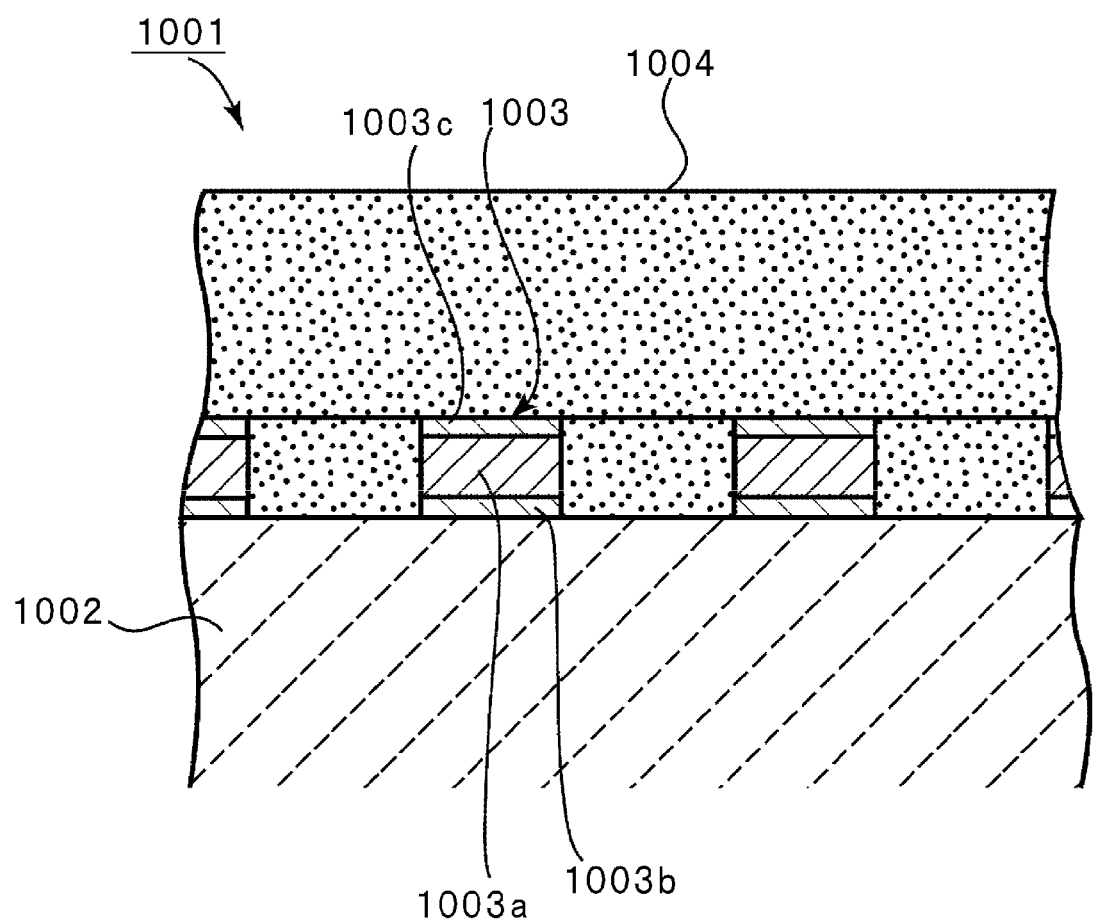
FIG. 23 is a partially cutaway cross-sectional view of a known surface acoustic wave device.

Furthermore, the present invention can be used in elastic wave devices other than a surface acoustic wave device, e.g., an elastic boundary wave device. FIG. 22A is a front cross-sectional view that schematically shows an example of an elastic boundary wave device to which the present invention is applied, and FIG. 22B is a schematic front cross-sectional view showing the relevant portion thereof. In an elastic boundary wave device 201, an electrode 231 is provided between a piezoelectric substrate 202 and a dielectric material 232. This electrode 231 includes an IDT, a first wiring connected to the IDT, and a second wiring pattern connected to electrode pads 203 and 206 in accordance with a preferred embodiment of the present invention. This electrode structure includes a first multilayer electrically conductive film and a second multilayer electrically conductive film. The first multilayer electrically conductive film defines the IDT and the first wiring connected to the IDT. The second multilayer electrically conductive film defines the electrode pads 203 and 206 and the second wiring pattern leading to the electrode pads 203 and 206. The IDT, the first wiring pattern, and the second wiring pattern are preferably the same as those in the preferred embodiments described above.

A plurality of through-holes are provided in the dielectric material 232 so as to expose the electrode pads 203 and 206. As shown in FIG. 22B, under-bump metal layers 234 and 235 are provided in the through-holes. A metal bump 207 is provided on the under-bump metal layer 235. Here, at least one contact portion 216 is formed by overlapping the second wiring pattern on a portion of the first wiring pattern. Also in such an elastic boundary wave device, an increase in the contact resistance between the first multilayer electrically conductive film and the second multilayer electrically conductive film in the contact portion 216 can be prevented. Accordingly, the insertion loss can be reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:
   a piezoelectric substrate;
   a first multilayer electrically conductive film disposed on the piezoelectric substrate; and
   a second multilayer electrically conductive film disposed on the piezoelectric substrate; wherein
   the first multilayer electrically conductive film defines at least an IDT including a plurality of electrode fingers and a first wiring pattern connected to the IDT;
   the second multilayer electrically conductive film defines at least an electrode pad and a second wiring pattern leading to the electrode pad;
   at least one contact portion where the second wiring pattern is overlapped with the first wiring pattern is provided;
   the second multilayer electrically conductive film includes a bottom electrically conductive film including Al or an alloy mainly containing Al;
   the first multilayer electrically conductive film includes a top electrically conductive film including Ti and an Al-based electrically conductive film including Al or an alloy mainly containing Al and disposed lower than the top electrically conductive film; and
   the first multilayer electrically conductive film further includes an electrically conductive film that is stacked lower and has a higher density than the Al-based electrically conductive film and includes Pt or an alloy mainly including Pt.

2. The elastic wave device according to claim 1, wherein the first multilayer electrically conductive film further includes a Ti film stacked between the Al-based electrically conductive film and the high-density electrically conductive film.

3. The elastic wave device according to claim 1, wherein the second multilayer electrically conductive film further includes a Ti film disposed higher than the bottom electrically conductive film and an Al-based electrically conductive film disposed higher than the Ti film and including Al or an alloy mainly containing Al.

4. The elastic wave device according to claim 1, further comprising a package, wherein an elastic wave filter chip including the piezoelectric substrate and the first and second multilayer electrically conductive films is flip-chip bonded to the package.

* * * * *